(12) United States Patent
Ryu et al.

(10) Patent No.: US 11,910,613 B2
(45) Date of Patent: Feb. 20, 2024

(54) SEMICONDUCTOR MEMORY DEVICE, ELECTRONIC SYSTEM INCLUDING THE SAME, AND METHOD OF FABRICATING THE SAME

(71) Applicant: SAMSUNG ELECTRONICS CO., LTD., Suwon-si (KR)

(72) Inventors: Hyo Joon Ryu, Hwaseong-si (KR); Hee Suk Kim, Hwaseong-si (KR); Jeong Yong Sung, Hwaseong-si (KR); Jee Hoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 159 days.

(21) Appl. No.: 17/530,220

(22) Filed: Nov. 18, 2021

(65) Prior Publication Data

US 2022/0359557 A1    Nov. 10, 2022

(30) Foreign Application Priority Data

May 6, 2021    (KR) .......................... 10-2021-0058470

(51) Int. Cl.
*H10B 43/27* (2023.01)
*H10B 43/50* (2023.01)
*H01L 23/522* (2006.01)
*H10B 43/40* (2023.01)

(52) U.S. Cl.
CPC ......... *H10B 43/50* (2023.02); *H01L 23/5226* (2013.01); *H10B 43/27* (2023.02); *H10B 43/40* (2023.02)

(58) Field of Classification Search
CPC ........ H10B 43/50; H10B 43/27; H10B 43/40; H10B 43/10; H10B 43/20; H10B 43/30; H01L 23/5226; H01L 25/0657; H01L 2225/06541
See application file for complete search history.

(56) References Cited

U.S. PATENT DOCUMENTS 9,929,174 B1 * 3/2018 Mizutani ................ H10B 43/27
10,685,914 B2   6/2020 Lee
2016/0329340 A1 * 11/2016 Hwang .................. H10B 43/40
(Continued)

FOREIGN PATENT DOCUMENTS

JP      2020126888 A2   8/2020
KR        2044823 B1    9/2014
(Continued)

*Primary Examiner* — Benjamin P Sandvik
*Assistant Examiner* — John Patrick Cornely
(74) *Attorney, Agent, or Firm* — Fish & Richardson P.C.

(57) ABSTRACT

A semiconductor memory device includes a mold structure including a plurality of wordlines on a front side of a first substrate, and a string selection line and a stopper line on the plurality of wordlines. A channel structure extends in a vertical direction to penetrate the mold structure. A block separation area extends in a first direction to cut the mold structure. A protective structure is interposed between the block separation area and the stopper line and not between the block separation area and the string selection line and not between the block separation area and the plurality of wordlines. A string separation structure extends in the first direction to cut the string selection line and the stopper line. A bitline extends in a second direction on the mold structure. A bitline contact connects the channel structure and the bitline.

20 Claims, 31 Drawing Sheets

(56) References Cited

U.S. PATENT DOCUMENTS

| | | | |
|---|---|---|---|
| 2019/0157284 A1* | 5/2019 | Park | H01L 23/535 |
| 2019/0312054 A1* | 10/2019 | Yun | H10B 43/10 |
| 2020/0105721 A1* | 4/2020 | Park | H01L 24/89 |
| 2020/0212059 A1 | 7/2020 | Nishikawa | |
| 2020/0273876 A1 | 8/2020 | Kashima et al. | |
| 2022/0068962 A1* | 3/2022 | Lee | H10B 43/27 |

FOREIGN PATENT DOCUMENTS

| | | |
|---|---|---|
| KR | 20140105954 A | 9/2014 |
| KR | 20190006758 A | 1/2019 |
| KR | 20200042274 A | 4/2020 |
| KR | 20200103484 A | 9/2020 |
| KR | 20200134577 A | 12/2020 |

\* cited by examiner

SEMICONDUCTOR MEMORY DEVICE, ELECTRONIC SYSTEM INCLUDING THE SAME, AND METHOD OF FABRICATING THE SAME

CROSS-REFERENCE TO RELATED APPLICATION

This U.S. non-provisional patent application claims the benefit of priority under 35 U.S.C. § 119 to Korean Patent Application No. 10-2021-0058470, filed on May 6, 2021 in the Korean Intellectual Property Office, the disclosure of which is incorporated herein by reference in its entirety.

BACKGROUND

1. Technical Field

The present disclosure relates to a semiconductor memory device, an electronic system including the same, and a method of fabricating the same. More particularly, the present disclosure relates to a semiconductor memory device including bitline contacts, an electronic system including the semiconductor memory device, and a method of fabricating the semiconductor memory device.

2. Description of the Related Art

There has been a demand for raising the integration density of semiconductor memory devices in order to meet customer demands for high performance and low price. For example, integration density is one of the most important factors for determining price for a semiconductor memory device.

The integration density of a conventional two-dimensional (2D) or planar semiconductor memory device is determined by the area occupied by each unit memory cell and is thus considerably affected by the level of fine pattern-forming technology. However, as expensive equipment is required for the miniaturization of patterns, there still exists a limit in increasing the integration density of a 2D semiconductor memory device. Accordingly, a three-dimensional (3D) semiconductor memory device including memory cells that are arranged three-dimensionally has been suggested.

SUMMARY

Embodiments of the present disclosure provide a semiconductor memory device with improved process margins and an improved product reliability.

Embodiments of the present disclosure also provide an electronic system including a semiconductor memory device with improved process margins and an improved product reliability.

Embodiments of the present disclosure also provide a method of fabricating a semiconductor memory device with improved process margins and an improved product reliability.

However, embodiments of the present disclosure are not restricted to those set forth herein. The above and other embodiments of the present disclosure will become more apparent to one of ordinary skill in the art(s) to which the present disclosure pertains by referencing the detailed description of the present disclosure given below.

According to an aspect of the present disclosure, a semiconductor memory device comprises a mold structure, a channel structure, a block separation area, a protective structure, a string separation structure, a bitline, and a bitline contact. The mold structure includes a plurality of wordlines, which are sequentially stacked on a front side of a first substrate, and a string selection line and a stopper line, which are sequentially stacked on the plurality of wordlines. The channel structure extends in a vertical direction, which intersects the front side of the first substrate, to penetrate the mold structure. The block separation area extends in a first direction, which intersects the vertical direction, to cut the mold structure. The protective structure is interposed between the block separation area and the stopper line. and not between the block separation area and the string selection line and between the block separation area and the plurality of wordlines. The string separation structure extends in the first direction to cut the string selection line and the stopper line. The bitline extends in a second direction, which intersects the vertical direction and the first direction, on the mold structure. The bitline contact connects the channel structure and the bitline.

According to another aspect of the present disclosure, a semiconductor memory device comprises a mold structure, a first channel structure, a string separation structure, a bitline, and a first bitline contact. The mold structure includes a plurality of wordlines, which are sequentially stacked on a front side of a substrate, and a string selection line and a stopper line, which are sequentially stacked on the plurality of wordlines. The first channel structure extends in a vertical direction, which intersects the front side of the substrate, to penetrate the mold structure. The string separation structure extends in a first direction, which intersects the vertical direction, to cut the string selection line and the stopper line. The string separation structure at least partially overlaps with the first channel structure. The bitline extends in a second direction, which intersects the vertical direction and the first direction, on the mold structure. The first bitline contact connects the first channel structure and the bitline. The first bitline contact is shifted from a center of the first channel structure in a direction away from the string separation structure.

According to another aspect of the present disclosure, an electronic system comprises a main substrate, a semiconductor memory device on the main substrate, and a controller electrically connected to the semiconductor memory device, on the main substrate. The semiconductor memory device includes a mold structure, a channel structure, a string separation structure, a bitline, a bitline contact, a peripheral circuit element, and an input-output pad. The mold structure includes a plurality of wordlines, which are sequentially stacked on a front side of a substrate, and a string selection line and a stopper line, which are sequentially stacked on the wordlines. The channel structure extends in a vertical direction, which intersects the front side of the substrate, to penetrate the mold structure. The string separation structure extends in a first direction, which intersects the vertical direction, to cut the string selection line and the stopper line. The string separation structure at least partially overlaps with the channel structure. The bitline extends in a second direction, which intersects the vertical direction and the first direction, on the mold structure. The bitline contact connects the channel structure and the bitline. The bitline contact is shifted from a center of the channel structure in a direction away from the string separation structure. The peripheral circuit element is connected to the bitline contact. The input/output pad connects the controller and the peripheral circuit element.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Semiconductor memory devices according to embodiments of the present disclosure will hereinafter be described with reference to FIG. 1 through FIG. 14.

Figure 1:
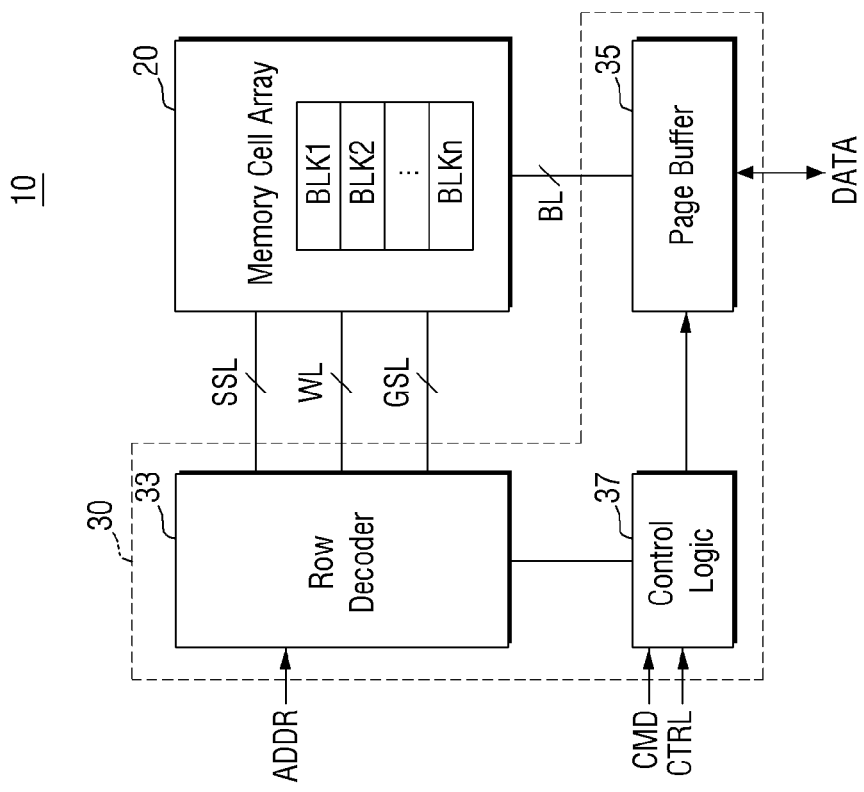
FIG. 1 is a block diagram illustrating a semiconductor memory device according to some embodiments of the present disclosure.

FIG. 1 is a block diagram illustrating a semiconductor memory device according to some embodiments of the present disclosure.

Referring to FIG. 1, a semiconductor memory device 10 includes a memory cell array 20 and a peripheral circuit 30.

The memory cell array 20 may include a plurality of memory cell blocks including a first memory cell block BLK1 through n-th memory cell block BLKn. Each of the first memory cell block BLK1 through n-th memory cell block BLKn may include a plurality of memory cells. The memory cell array 20 may be connected to the peripheral circuit 30 through bitlines BL, wordlines WL, one or more string selection lines SSL, and one or more ground selection lines GSL. Specifically, the first memory cell block BLK1 through n-th memory cell block BLKn may be connected to a row decoder 33 through the wordlines WL, the string selection lines SSL, and the ground selection lines GSL. The first memory cell block BLK1 through n-th memory cell block BLKn may be connected to a page buffer 35 through the bitlines BL.

The peripheral circuit 30 may receive an address ADDR, a command CMD, and a control signal CTRL from outside the semiconductor memory device 10 and may exchange data "DATA" with an external device outside the semiconductor memory device 10. The peripheral circuit 30 may include a control logic 37, the row decoder 33, and the page buffer 35. Although not specifically illustrated, the peripheral circuit 30 may further include various sub-circuits such as an input/output circuit, a voltage generating circuit for generating various voltages necessary for the operation of the semiconductor memory device 10, and an error correction circuit for correcting error in data "DATA" read from the memory cell array 20.

The control logic 37 may be connected to the row decoder 33, an input/output circuit, and the voltage generating circuit. The control logic 37 may control the general operation of the semiconductor memory device 10. The control logic 37 may generate various internal control signals for use in the semiconductor memory device 10 in response to the control signal CTRL. For example, the control logic 37 may control the levels of voltages provided to the wordlines WL and the bitlines BL during a memory operation such as a program operation or an erase operation.

The row decoder 33 may select at least one of the first memory cell block BLK1 through n-th memory cell block BLKn in response to the address ADDR and may select at least one of the wordlines WL, the string selection lines SSL, and the ground selection lines GSL of the selected memory cell block. Also, the row decoder 33 may transmit a voltage for performing a memory operation to the selected wordline(s) WL of the selected memory cell block.

The page buffer 35 may be connected to the memory cell array 20 via the bitlines BL. The page buffer 35 may operate as a write driver or a sense amplifier. Specifically, during a program operation, the page buffer 35 may operate as a write driver and may apply a voltage corresponding to data "DATA" to be written to the memory cell array 20 to the bitlines BL. On the contrary, during a read operation, the page buffer 35 may operate as a sense amplifier and may sense data "DATA" stored in the memory cell array 20.

Figure 2:
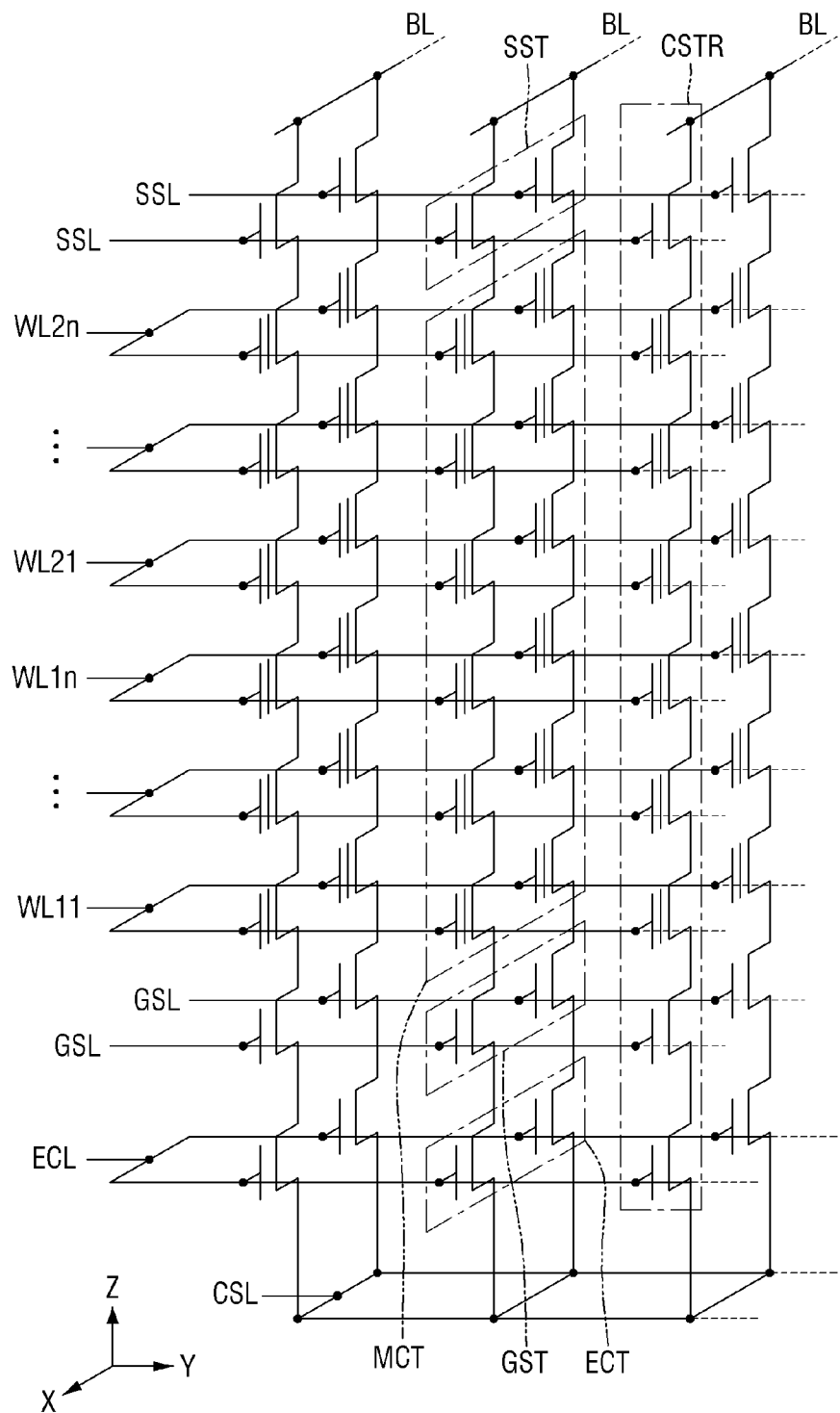
FIG. 2 is a circuit diagram illustrating a semiconductor memory device according to some embodiments of the present disclosure.

FIG. 2 is a circuit diagram illustrating a semiconductor memory device according to some embodiments of the present disclosure.

Referring to FIG. 2, a memory cell array of a semiconductor memory device according to some embodiments of the present disclosure includes common source lines CSL, a plurality of bitlines BL, and a plurality of cell strings CSTR. An example of the memory cell array in FIG. 2 is the memory cell array 20 of FIG. 1.

The common source lines CSL may extend in a first direction Y. In some embodiments, a plurality of common source lines CSL may be arranged two-dimensionally. For example, the common source lines CSL may be spaced apart from one another to extend in the first direction Y. The same voltage may be applied to the common source lines CSL. Alternatively, different voltages may be applied to the common source lines CSL so that the common source lines CSL may be controlled separately.

The bitlines BL may be arranged two-dimensionally. For example, the bitlines BL may be spaced apart from one another to extend in a second direction X, which intersects the first direction Y. Multiple cell strings CSTR may be connected in parallel to each of the bitlines BL and may be connected in common to each of the common source lines CSL. That is, multiple cell strings CSTR may be disposed between the bitlines BL and the common source lines CSL.

Each of the cell strings CSTR may include a ground selection transistor GST, which is connected to one of the common source line CSL, a string selection transistor SST, which is connected to one of the bitlines BL, and a plurality of memory cell transistors MCT, which are disposed between the ground selection transistor GST and the string selection transistor SST. Each of the memory cell transistors MCT may include a data storage element. The ground selection transistor GST, the string selection transistor SST, and the memory cell transistors MCT may be connected in series.

Each of the common source lines CSL may be connected in common to the sources of ground selection transistors GST. Ground selection lines GSL, a plurality of wordlines (WL11 through WL1n and WL21 through WL2n), and string selection lines SSL may be disposed between the common source lines CSL and the bitlines BL. The ground selection lines GSL may be used as the gate electrodes of the ground selection transistors GST. The wordlines (WL11 through WL1n and WL21 through WL2n) may be used as the gate electrodes of memory cell transistors MCT. The string selection lines SSL may be used as the gate electrodes of string selection transistors SST.

In some embodiments, erase control transistors ECT may be disposed between the common source lines CSL and the ground selection transistors GST. The common source lines CSL may be connected in common to the sources of the erase control transistors ECT. Erase control lines ECL may be disposed between the common source lines CSL and the ground selection liens GSL. The erase control lines ECL may be used as the gate electrodes of the erase control transistors ECT. The erase control transistors ECT may cause gate-induced drain leakage (GIDL) and may thus perform an erase operation of the memory cell array.

Figure 3A:
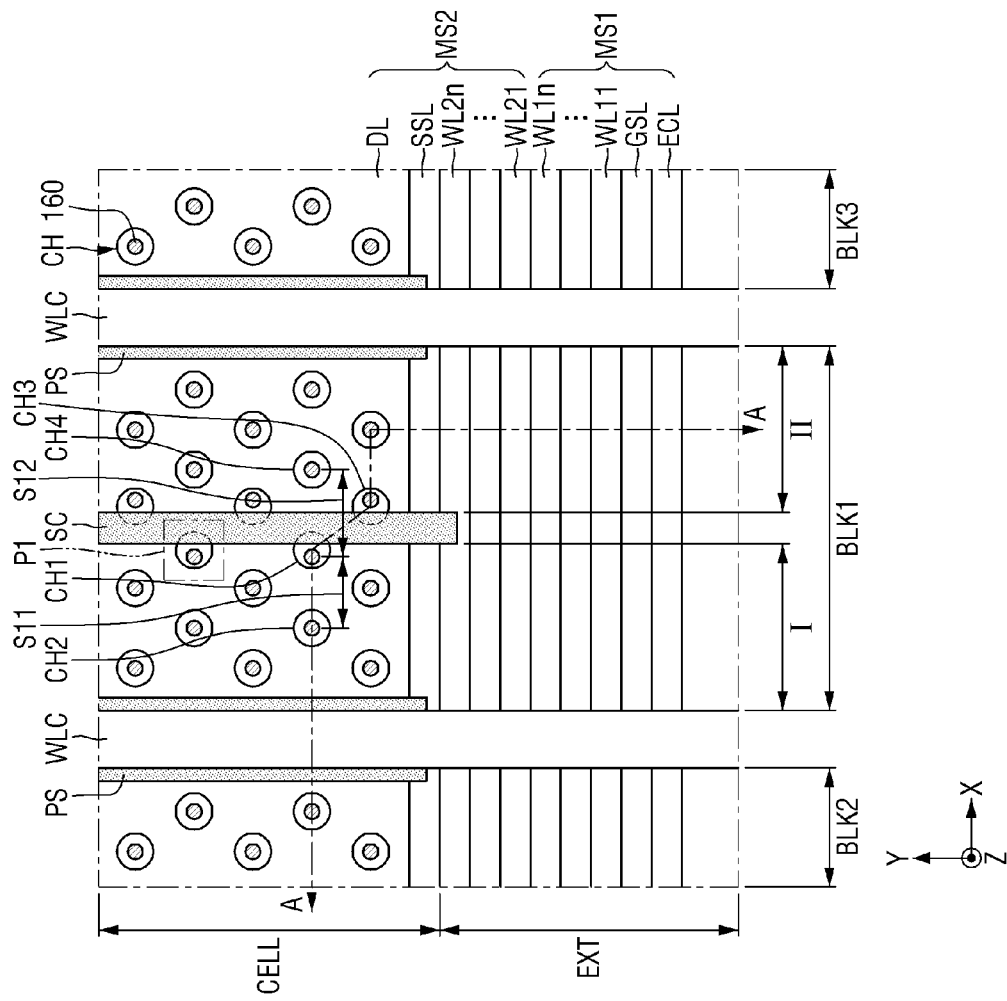
FIG. 3A is a layout view illustrating a semiconductor memory device according to some embodiments of the present disclosure.
Figure 3B:
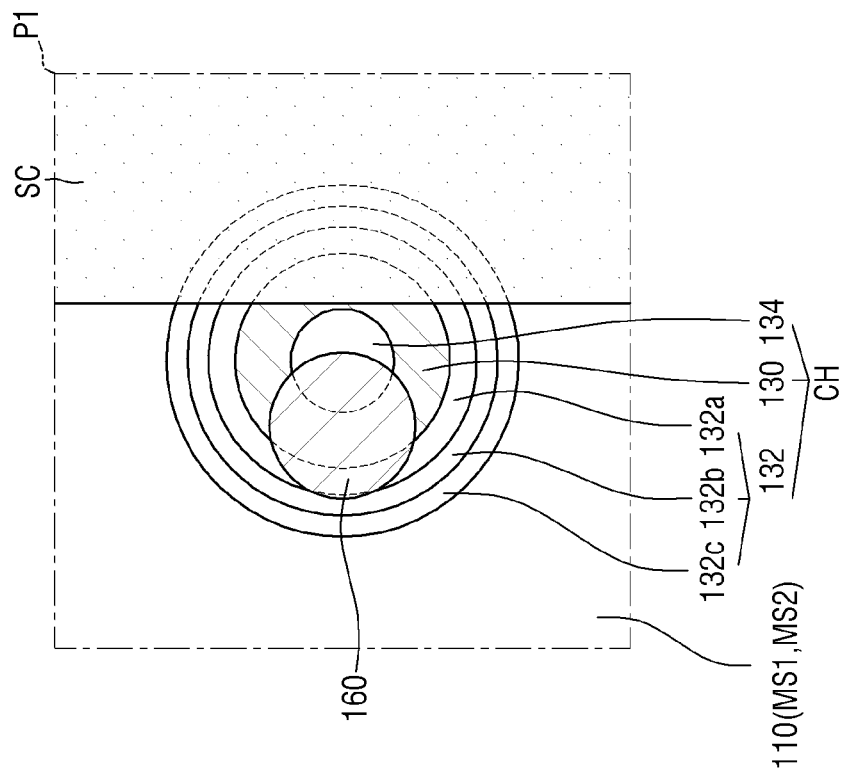
FIG. 3B is an enlarged layout view illustrating an area P1 of FIG. 3A.

FIG. 3A is a layout view illustrating a semiconductor memory device according to some embodiments of the present disclosure. FIG. 3B is an enlarged layout view illustrating an area P1 of FIG. 3A. For convenience, FIG. 3B does not illustrate a channel pad 136.

Figure 4:
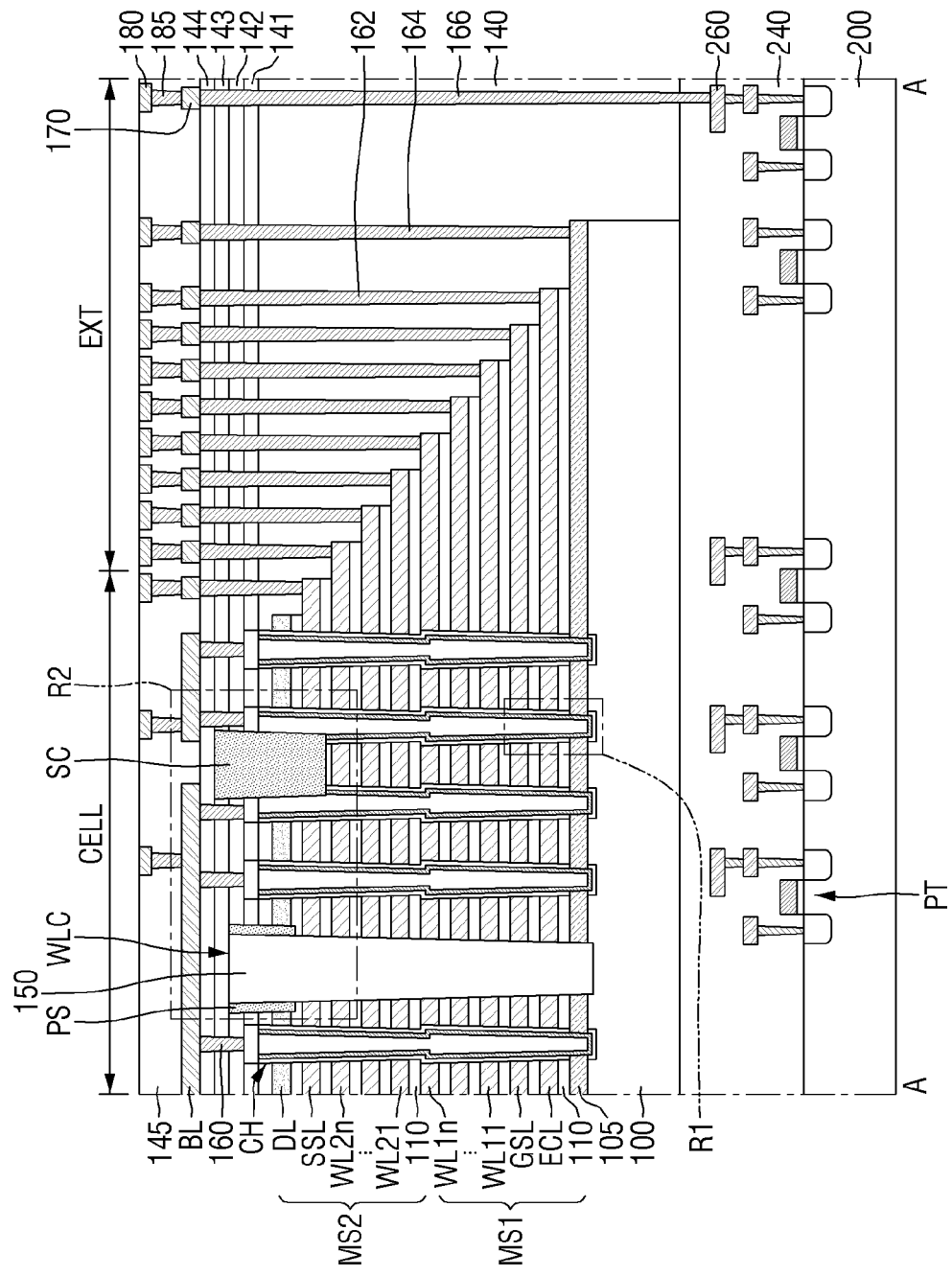
FIG. 4 is a cross-sectional view taken along line A-A of FIG. 3A.
Figure 5:
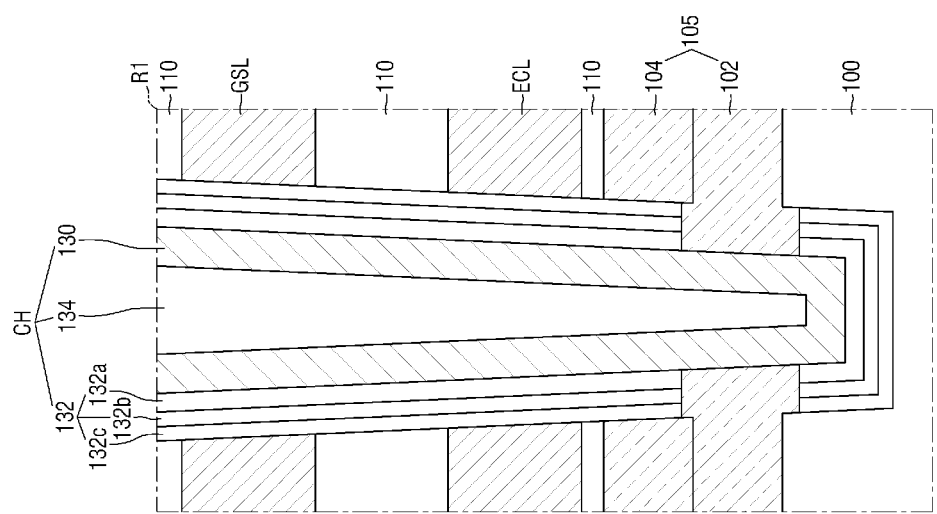
FIG. 5 is an enlarged cross-sectional view illustrating a region R1 of FIG. 4.
Figure 6A:
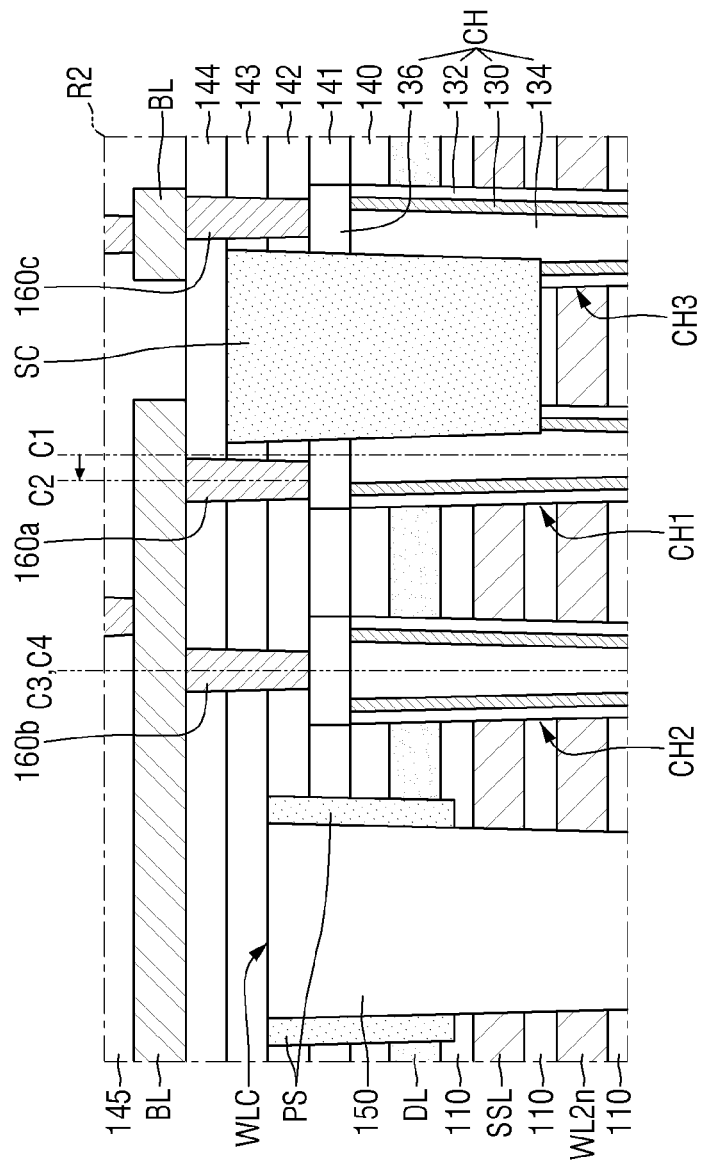
FIG. 6A and FIG. 6B are enlarged cross-sectional views illustrating a region R2 of FIG. 4.
Figure 6B:
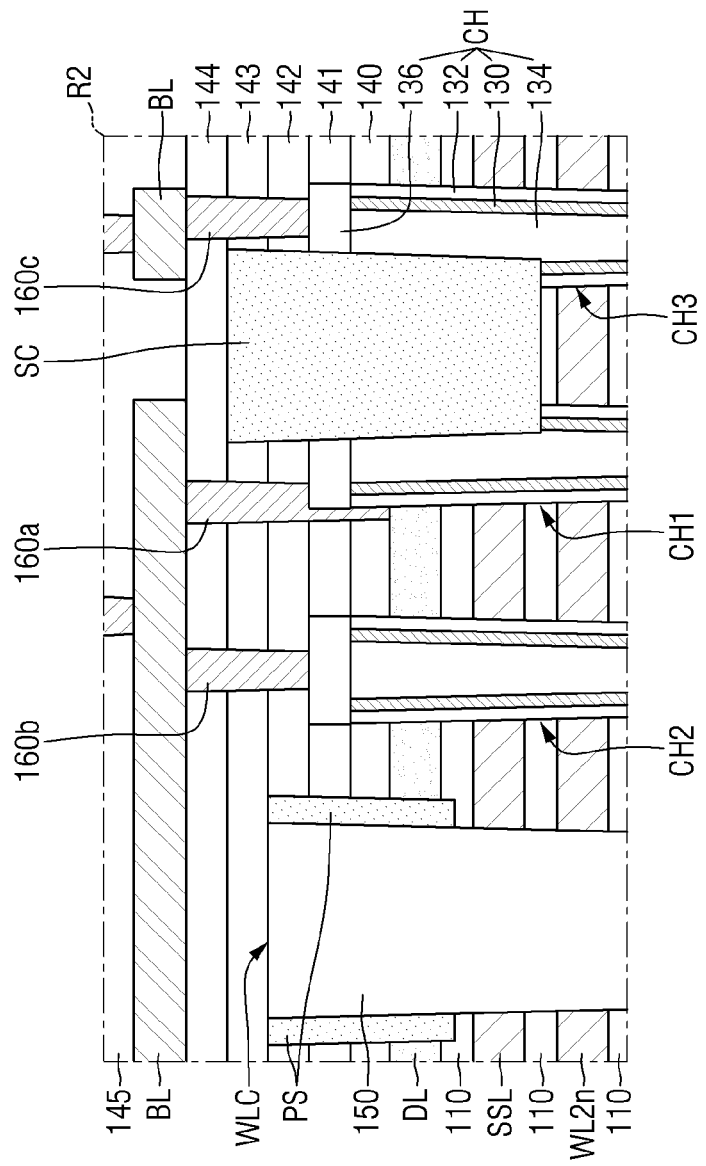
Figure 7A:
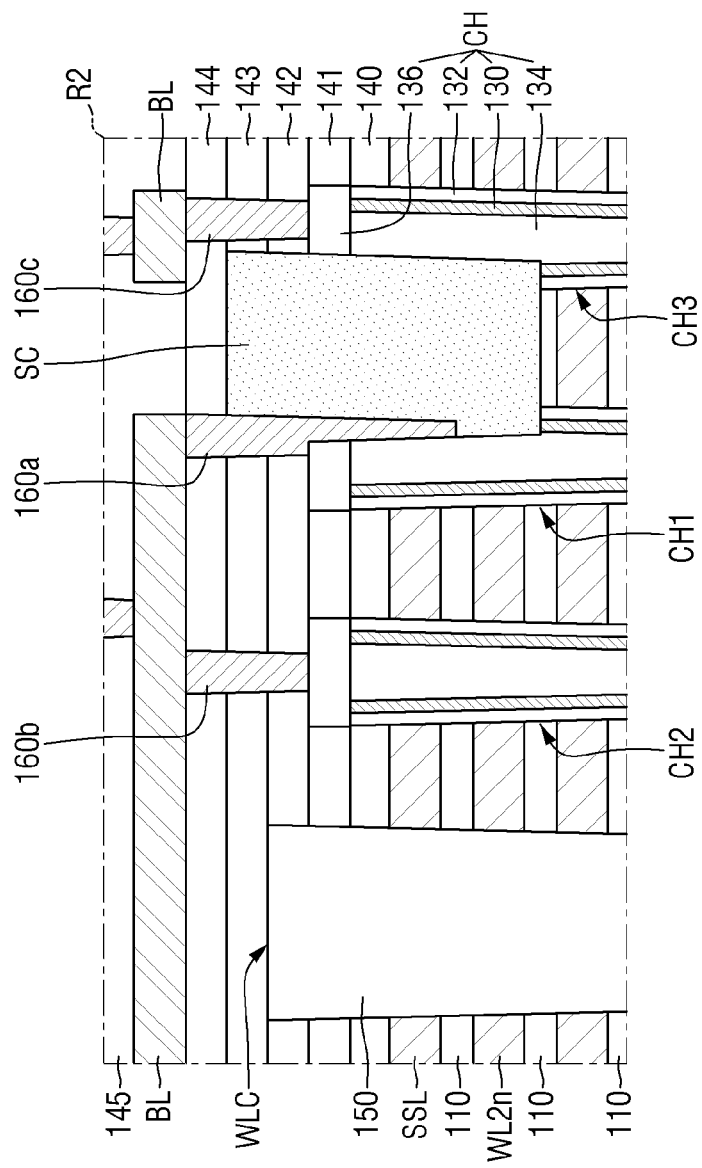
FIG. 7A and FIG. 7B are cross-sectional views illustrating the effects of the semiconductor memory device according to some embodiments of the present disclosure.
Figure 7B:
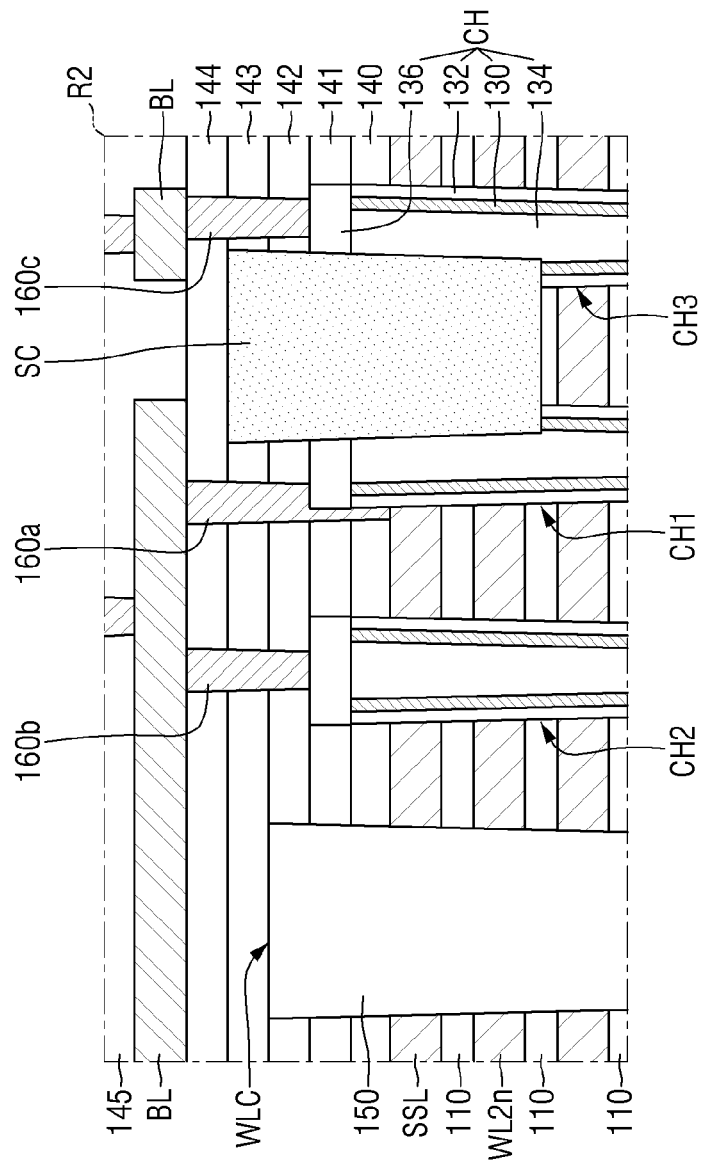

FIG. 4 is a cross-sectional view taken along line A-A of FIG. 3A. FIG. 5 is an enlarged cross-sectional view illustrating a region R1 of FIG. 4. FIG. 6A and FIG. 6B are enlarged cross-sectional views illustrating a region R2 of FIG. 4. FIG. 7A and FIG. 7B are cross-sectional views illustrating the effects of the semiconductor memory device according to some embodiments of the present disclosure.

Referring to FIGS. 3A through 6B, the semiconductor memory device according to some embodiments of the present disclosure includes a first substrate 100, a mold structure (MS1 and MS2), channel structures CH, block separation areas WLC, protective structures PS, a string separation structure SC, bitlines BL, bitline contacts 160, a second substrate 200, and peripheral circuit elements PT.

The first substrate 100 may include a semiconductor substrate such as, for example, a silicon substrate, a germanium substrate, or a silicon-germanium substrate. Alternatively, the first substrate 100 may include a silicon-on-insulator (SOI) substrate or a germanium-on-insulator (GOI) substrate. In some embodiments, the first substrate 100 may include impurities. For example, the first substrate 100 may include n-type impurities (e.g., phosphorus (P) or arsenic (As)).

The first substrate 100 may include a cell array region CELL and an extension region EXT.

A memory cell array, which includes a plurality of memory cells, may be formed in the cell array region CELL. An example of such a memory cell array is the memory cell array 20 of FIG. 1. For example, the channel structures CH, the bitlines BL, and gate electrodes (ECL, GSL, WL11 through WL1n, WL21 through WL2n, and SSL) may be disposed in the cell array region CELL. In the description that follows, a surface of the first substrate 100 where the memory cell array is disposed may be referred to as a front side of the first substrate 100, and a surface of the first substrate 100 that is opposite to the front side of the first substrate 100 may be referred to as a back side of the first substrate 100.

The extension region EXT may be disposed near the cell array region CELL. The gate electrodes (ECL, GSL, WL11 through WL1n, WL21 through WL2n, and SSL) may be stacked in a stepwise manner in the extension region EXT.

The mold structure (MS1 and MS2) may be formed on the front side of the first substrate 100. For example, the mold structure (MS1 and MS2) may be stacked on the top surface of the first substrate. The mold structure (MS1 and MS2) may include the gate electrodes (ECL, GSL, WL11 through WL1n, WL21 through WL2n, and SSL), a stopper line DL, and a plurality of mold insulating films 110, which are stacked on the first substrate 100.

The gate electrodes (ECL, GSL, WL11 through WL1n, WL21 through WL2n, and SSL), the stopper line DL, and the mold insulating films 110 may have a layered structure that extends in parallel to the front side of the first substrate 100. The gate electrodes (ECL, GSL, WL11 through WL1n, WL21 through WL2n, and SSL) and the mold insulating films 110 may be alternately stacked on the first substrate 100. The stopper line DL may be stacked on the gate electrodes (ECL, GSL, WL11 through WL1n, WL21 through WL2n, and SSL). The mold insulating films 110 may be interposed between the gate electrodes (ECL, GSL, WL11 through WL1n, WL21 through WL2n, and SSL) and between the gate electrodes (ECL, GSL, WL11 through WL1n, WL21 through WL2n, and SSL) and the stopper line DL.

In some embodiments, the mold structure (MS1 and MS2) may include first mold structure MS1 and second mold structure MS2.

The first mold structure MS1 may include a plurality of first gate electrodes (ECL, GSL, and WL11 through WL1n), which are sequentially stacked on the first substrate 100. The first gate electrodes (ECL, GSL, and WL11 through WL1n) and mold insulating films 110 may be alternately stacked on the first substrate 100.

In some embodiments, the first gate electrodes (ECL, GSL, and WL11 through WL1n) may include an erase control line ECL, a ground selection line GSL, and a plurality of first wordlines WL11 through WL1n, which are sequentially stacked on the first substrate 100. In other embodiments, the erase control line ECL may not be provided.

The second mold structure MS2 may include second gate electrodes (WL21 through WL2n and SSL) and the stopper line DL, which are sequentially stacked on the first mold structure MS1. The second gate electrodes (WL21 through WL2n and SSL) and mold insulating films 110 may be alternately stacked on the first mold structure MS1. The stopper line DL may be stacked on the second gate electrodes (WL21 through WL2n and SSL). Mold insulating films 110 may be interposed between the second gate electrodes (WL21 through WL2n and SSL) and between the second gate electrodes (WL21 through WL2n and SSL) and the stopper line DL.

In some embodiments, the second gate electrodes (WL21 through WL2n and SSL) may include a plurality of second wordlines WL21 through WL2n and a string selection line SSL, which are sequentially stacked on the first mold structure MS1. That is, the string selection line SSL and the stopper line DL may be sequentially stacked on the second wordlines WL21 through WL2n.

The first gate electrodes (ECL, GSL, and WL11 through WL1n) and the second gate electrodes (WL21 through WL2n and SSL) may include a conductive material. For example, the first gate electrodes (ECL, GSL, and WL11 through WL1n) and the second gate electrodes (WL21 through WL2n and SSL) may include a metal such as tungsten (W), cobalt (Co), or nickel (Ni) or a semiconductor material such as silicon (Si), but the present disclosure is not limited thereto.

The mold insulating films 110 may include an insulating material. For example, the mold insulating films 110 may include at least one of silicon oxide, silicon nitride, and silicon oxynitride, but the present disclosure is not limited thereto.

The stopper line DL may include an insulating material. For example, the stopper line DL may include at least one of silicon oxide, silicon nitride, and silicon oxynitride, but the present disclosure is not limited thereto. The stopper line DL may include a different material from the mold insulating films 110. That is, the stopper line DL may include at least one material not included in the mold insulating films 110, and/or the mold insulating films 110 may include at least one material not included in the stopper line DL. For example, the mold insulating films 110 may include silicon oxide, and the stopper line DL may include silicon nitride, silicon oxynitride, or polysilicon. Preferably, the mold insulating films 110 may include silicon oxide, and the stopper line DL may include silicon nitride or silicon oxynitride.

A first interlayer insulating film 140 may be formed on the first substrate 100. The first interlayer insulating film 140 may cover the mold structure (MS1 and MS2). The first interlayer insulating film 140 may include at least one of, for example, silicon oxide, silicon oxynitride, and a low-k material having a smaller dielectric constant than silicon oxide, but the present disclosure is not limited thereto.

The channel structures CH may extend in a vertical direction (hereinafter, a third direction Z) that intersects the front side of the first substrate 100 and may thus penetrate the mold structure (MS1 and MS2). The vertical direction which is the third direction Z is the direction from the bottom of FIG. 4 to the top of FIG. 4. For example, the channel structures CH may have a pillar shape (e.g., a cylindrical shape) extending in the third direction Z. Accordingly, the channel structures CH may intersect the gate electrodes (ECL, GSL, WL11 through WL1n, WL21 through WL2n, and SSL) and the stopper line DL. Each of the channel structures CH may include a semiconductor pattern 130 and an information storage film 132.

The semiconductor pattern 130 may extend in the third direction Z and may penetrate the mold structure (MS1 and MS2). The semiconductor pattern 130 may have a cup shape, but the present disclosure is not limited thereto. For example, the semiconductor pattern 130 may have various shapes such as a cylindrical shape or a rectangular pillar shape. The semiconductor pattern 130 may include, for example, a semiconductor material such as monocrystalline silicon, polycrystalline silicon, an organic semiconductor, or a carbon nanostructure, but the present disclosure is not limited thereto.

The information storage film 132 may be interposed between the semiconductor pattern 130 and the gate electrodes (ECL, GSL, WL11 through WL1n, WL21 through WL2n, and SSL) and between the semiconductor pattern 130 and the stopper line DL. For example, the information storage film 132 may extend along the outer side surface of the semiconductor pattern 130.

The information storage film 132 may include at least one of, for example, silicon oxide, silicon nitride, silicon oxynitride, and a high-k material having a larger dielectric constant than silicon oxide. The high-k material may include at least one of, for example, aluminum oxide, hafnium oxide, lanthanum oxide, tantalum oxide, titanium oxide, lanthanum hafnium oxide, lanthanum aluminum oxide, dysprosium scandium oxide, and a combination thereof.

In some embodiments, the information storage film 132 may be formed as a multifilm. For example, as illustrated in FIG. 3B and FIG. 5, the information storage film 132 may include a tunnel insulating film 132a, a charge storage film 132b, and a blocking insulating film 132c, which are sequentially stacked on the outer side surface of the semiconductor pattern 130.

The tunnel insulating film 132a may include, for example, silicon oxide or a high-k material (e.g., aluminum oxide ($Al_2O_3$) or hafnium oxide ($HfO_2$)) having a larger dielectric constant than silicon oxide. The charge storage film 132b may include, for example, silicon nitride. The blocking insulating film 132c may include, for example, silicon oxide or a high-k (e.g., $Al_2O_3$ or $HfO_2$) having a larger dielectric constant than silicon oxide.

In some embodiments, each of the channel structures CH may further include a filler pattern 134. The filler pattern 134 may be formed to fill the inside of the semiconductor pattern 130, which is cup-shaped. The filler pattern 134 may include an insulating material such as, for example, silicon oxide, but the present disclosure is not limited thereto.

In some embodiments, each of the channel structures CH may further include a channel pad 136. The channel pad 136 may be formed to be connected to the semiconductor pattern 130. For example, a second interlayer insulating film 141 may be formed on the first interlayer insulating film 140. The channel pad 136 may be formed in the second interlayer insulating film 141 to be connected to the top of the semiconductor pattern 130. The channel pad 136 may include, for example, polysilicon doped with impurities, but the present disclosure is not limited thereto.

In some embodiments, the channel structures CH may be arranged in a zigzag fashion. For example, as illustrated in FIG. 3A, the channel structures CH may be arranged in a staggered manner in the first direction Y and second direction X. The channel structures CH, which are arranged in a zigzag fashion, can further improve the integration density of the semiconductor memory device according to some embodiments of the present disclosure. In some embodiments, the channel structures CH may be arranged in a honeycomb fashion.

The channel structures CH are illustrated as being formed only in the mold structure (MS1 and MS2) in the cell array region CELL, but the present disclosure is not limited thereto. Dummy channel structures having a similar shape to the channel structures CH may be formed in the mold structure (MS1 and MS2) in the extension region EXT. The dummy channel structures may extend in the third direction Z and may penetrate the first interlayer insulating film 140 and the mold structure (MS1 and MS2).

In some embodiments, a source structure 105 may be formed on the first substrate 100. The source structure 105 may be interposed between the first substrate 100 and the mold structure (MS1 and MS2). For example, the source structure 105 may extend along the front side of the first substrate 100. The source structure 105 may include, for example, a metal or polysilicon doped with impurities, but the present disclosure is not limited thereto.

The source structure 105 may be formed to be connected to the semiconductor patterns 130 of the channel structures CH. For example, as illustrated in FIG. 5, the source structure 105 may be in direct contact with the semiconductor patterns 130 of the channel structures CH through the information storage films 132 of the channel structures CH. The source structure 105 may be provided as, for example, the common source lines CSL of FIG. 2. In some embodiments, the channel structures CH may penetrate the source structure 105. For example, the bottoms of the channel structures CH may be buried in the first substrate 100 through the source structure 105.

In some embodiments, the source structure 105 may be formed as a multifilm. For example, as illustrated in FIG. 5, the source structure 105 may include first semiconductor film 102 and second semiconductor film 104, which are sequentially stacked on the first substrate 100. The first semiconductor film 102 and second semiconductor film 104 may include polysilicon doped or not doped with impurities. The first semiconductor film 102 may be in contact with the semiconductor patterns 130 of the channel structures CH and may thus be provided as, for example, the common source lines CSL of FIG. 2. The second semiconductor film 104 may be used as a support layer for preventing the collapse of a mold stack during a replacement process for forming the first semiconductor film 102.

Although not specifically illustrated, a base insulating film may be interposed between the first substrate 100 and the source structure 105. The base insulating film may include at least one of, for example, silicon oxide, silicon nitride, and silicon oxynitride, but the present disclosure is not limited thereto.

In other embodiments, the source structure 105 may not be provided. For example, the semiconductor patterns 130 of the channel structures CH may be in contact with impurity regions formed in the first substrate 100. These impurity regions may be provided as, for example, the common source lines CSL of FIG. 2.

The block separation areas WLC may extend in the first direction Y (e.g., in a direction parallel to the front side of the first substrate 100), which intersects the third direction Z, to cut the mold structure (MS1 and MS2). The third direction Z is the direction from the bottom of FIG. 4 to the top of FIG. 4, the first direction Y is the direction into FIG. 4, and the front side of the first substrate 100 may be parallel to a plane formed by the first direction Y and a second direction X which runs from left to right in FIG. 4. The mold structure (MS1 and MS2) may be cut by a plurality of block separation areas WLC, thereby forming a plurality of memory cell blocks (e.g., first memory cell block BLK1 through third memory cell block BLK3). For example, two adjacent block separation areas WLC may define the first memory cell block BLK1 therebetween.

A plurality of channel structures CH may be disposed in each of the memory cell blocks (e.g., in each of the first memory cell block BLK1 through third memory cell block BLK3). For example, the channel structures CH may include first channel structure CH1 through fourth channel structure CH4, which are disposed in the first memory cell block BLK1.

FIG. 3A illustrates that in the first memory cell block BLK1, eight channel structures CH are arranged in a zigzag fashion in the first direction Y, but the present disclosure is not limited thereto. The number of channel structures CH disposed in each of the memory cell blocks (e.g., in each of the first memory cell block BLK1 through third memory cell block BLK3) is not particularly limited, but may vary.

In some embodiments, the block separation areas WLC may include insulating patterns 150. The insulating patterns 150 may be formed to fill the block separation areas WLC. The insulating patterns 150 may include at least one of, for example, silicon oxide, silicon nitride, and silicon oxynitride, but the present disclosure is not limited thereto. For example, the insulating patterns 150 may include silicon oxide.

The protective structures PS may be interposed between the block separation areas WLC and the stopper line DL. For example, as illustrated in FIG. 3A, the protective structures PS may extend along at least parts of both sides of each of the block separation areas WLC. In another example, the protective structures PS may extend along both sides of each of the block separation areas WLC.

The top surfaces of the protective structures PS may be positioned as high as, or higher than, the top surface of the stopper line DL. For example, as illustrated in FIG. 4, FIG. 6A, and FIG. 6B, a third interlayer insulating film 142 may be formed on the second interlayer insulating film 141. The top surfaces of the protective structures PS may be placed on the same plane as the top surface of the third interlayer insulating film 142. The term "same", as used herein, not only means that two elements are exactly identical, but also encompasses that the two elements are almost identical with slight differences therebetween that may arise from, for example, process margins. The top surfaces of the protective structures PS may be placed on the same plane as the top surfaces of the block separation areas WLC, but the present disclosure is not limited thereto. Alternatively, the top surfaces of the block separation areas WLC may be positioned higher than the top surfaces of the protective structures PS.

The bottom surfaces of the protective structures PS may be positioned as low as, or lower than, the bottom surface of the stopper line DL. For example, the bottom surfaces of the protective structures PS may be placed between the top surface of the string selection line SSL and the bottom surface of the stopper line DL. Accordingly, the protective structures PS may separate the stopper line DL from the block separation areas WLC.

The protective structures PS may not be interposed between the block separation areas WLC and the gate electrodes (ECL, GSL, WL11 through WL1n, WL21 through WL2n, and SSL). For example, the bottom surfaces of the protective structures PS may be positioned as high as, or higher than, the top surface of an uppermost gate electrode (e.g., the string selection line SSL). Accordingly, the protective structures PS may not separate the gate electrodes (ECL, GSL, WL11 through WL1n, WL21 through WL2n, and SSL) from the block separation areas WLC.

The protective structures PS may include an insulating material. For example, the protective structures PS may include at least one of silicon oxide, silicon nitride, and silicon oxynitride, but the present disclosure is not limited thereto. The protective structures PS may include a different material from the stopper line DL. That is, the protective structures PD may include at least one material not included in the stopper line DL, and/or the stopper line DL may include at least one material not included in the protective structures PD. For example, the stopper line DL may include silicon nitride, silicon oxynitride, or polysilicon, and the protective structures PS may include silicon oxide. Preferably, the stopper line DL may include silicon nitride or silicon oxynitride, and the protective structures PS may include silicon oxide.

The block separation areas WLC and the protective structures PS are illustrated as having boundaries therebetween, but the present disclosure is not limited thereto. Alternatively, there may not exist any boundaries between the block separation areas WLC and the protective structures PS.

The string separation structure SC may extend in the first direction Y and may cut the string selection line SSL. The mold structure (MS1 and MS2) may be divided by the string selection line SSL, thereby forming a plurality of string areas (e.g., first string area I and second string area II). For example, the string separation structure SC may define the first string area I and second string area II in the first memory cell block BLK1.

The string separation structure SC may divide the channel structures CH disposed in each of the memory cell blocks (e.g., in each of the first memory cell block BLK1 through third memory cell block BLK3). For example, the first channel structure CH1 and second channel structure CH2 may be disposed on one side of the string separation structure (e.g., in the first string area I), and the third channel structure CH3 and fourth channel structure CH4 may be disposed on the other side of the string separation structure SC (e.g., in the second string area II).

In some embodiments, the top surface of the string separation structure SC may be positioned higher than the top surfaces of the protective structures PS. For example, a fourth interlayer insulating film 143 may be formed on the third interlayer insulating film 142. The top surface of the string separation structure SC may be placed on the same plane as the top surface of the fourth interlayer insulating film 143. As the stopper line DL is stacked on the string selection line SSL, the string separation structure SC can cut not only the string selection line SSL, but also the stopper line DL.

The string separation structure SC may not cut the erase control line ECL, the ground selection line GSL, and the wordlines (WL11 through WL1n and WL21 through WL2n). For example, the bottom surface of the string separation structure SC may be positioned as high as, or higher than, the top surface of, for example, an uppermost wordline (e.g., a wordline WL2n).

The string separation structure SC may include an insulating material. For example, the string separation structure SC may include at least one of, for example, silicon oxide, silicon nitride, and silicon oxynitride, but the present disclosure is not limited thereto. The string separation structure SC may include a different material from the stopper line DL. That is, the string separation structure SC may include at least one material not included in the stopper line DL, and/or the stopper line DL may include at least one material not included in the string separation structure SC. For example, the stopper line DL may include silicon nitride, silicon oxynitride, or polysilicon, and the string separation structure SC may include silicon oxide. Preferably, the stopper line DL may include silicon nitride or silicon oxynitride, and the string separation structure SC may include silicon oxide.

In some embodiments, the string separation structure SC may overlap with at least some of the channel structures CH. The term "overlap", as used herein, may be taken to mean that two elements such as the string separation structure SC and one or more channel structures CH overlap with each other in a specified direction such as the third direction Z. For example, parts of the first channel structure CH1 and fourth channel structure CH4 may overlap with the string separation structure SC as shown in FIG. 6A and several other FIGs.

For example, as illustrated in FIG. 3B, the string separation structure SC may overlap with parts of the semiconductor pattern 130 of the channel structures CH and parts of the information storage films 132 of the channel structures CH. The string separation structure SC is illustrated as not overlapping with the filler patterns 134 of the channel structures CH, but the present disclosure is not limited thereto. Alternatively, the string separation structure SC may overlap with the filler patterns 134 of the channel structures CH.

The bitlines BL may be formed on the mold structure (MS1 and MS2). For example, the fourth interlayer insulating film 143 and a fifth interlayer insulating film 144 may be sequentially formed on the third interlayer insulating film 142. The bitlines BL may be formed on the fifth interlayer insulating film 144.

The bitlines BL may intersect the block separation areas WLC or an extension/projection of the block separation areas WLC in the third direction Z. For example, the bitlines BL may intersect the third direction Z (e.g., in parallel to the front side of the first substrate 100) and may extend in the second direction X, which intersects the first direction Y. As a reminder, the front side of the first substrate 100 may be parallel to a plane formed by the first direction Y (into the page in FIG. 4) and a second direction X running from left to right in FIG. 4. The bitlines BL may be connected to the channel structures CH. For example, the bitline contacts 160, which are connected to the top surfaces of the channel structures CH through the third interlayer insulating film 142 through fifth interlayer insulating film 144, may be formed. The bitlines BL may be electrically connected to the channel structures CH through the bitline contacts 160.

In some embodiments, bitline contacts 160 disposed near the string separation structure SC may be shifted in a direction away from the string separation structure SC. For example, as illustrated in FIG. 6A, a first bitline contact 160a, which is connected to the first channel structure CH1, may be formed. A center C2 of the first bitline contact 160a may be shifted in a direction away from the string separation structure SC and from a center C1 of the first channel structure CH1.

For example, as illustrated in FIG. 3B, the centers of the bitline contacts 160 may be shifted in a direction (e.g., in a leftward or rightward direction) away from the string separation structure SC and from the centers of their respective channel structures CH. The shifted bitline contacts 160 can improve the contact reliability with respect to the channel structures CH that overlap with the string separation structure SC. In some embodiments, the first bitline contact 160a may be spaced apart from the string separation structure SC. That is, the first bitline contact 160a may not be in contact with the string separation structure SC, and an example of this is illustrated in FIG. 6A.

In some embodiments, bitline contacts 160 spaced apart from the string separation structure SC may not be shifted. For example, a second bitline contact 160b, which is connected to the second channel structure CH2, may be formed, and an example of this is illustrated in FIG. 6A. The second channel structure CH2 may be spaced further apart from the channel separation structure SC than is the first channel structure CH1. A center C4 of the second bitline contact 160b may not be shifted from a center C3 of the second channel structure CH2.

A bitline contact 160 connected to the third channel structure CH3, like the first bitline contact 160a, may be shifted in a direction away from the string separation structure SC. For example, a third bitline contact 160c, which is connected to the third channel structure CH3, may be formed. The center of the third bitline contact 160c may be shifted in a direction away from the string separation structure SC and from the center of the third channel structure CH3. As the string separation structure SC is interposed between the first channel structure CH1 and third channel structure CH3, the first bitline contact 160a and third bitline contact 160c may be shifted in opposite directions.

In some embodiments, as some of the bitline contacts 160 are shifted, at least some of the bitline contacts 160 may not be arranged at regular intervals. For example, as illustrated in FIG. 3A, the second channel structure CH2 and fourth channel structure CH4 may be disposed on both sides of the first channel structure CH1. The first channel structure CH1, the second channel structure CH2, and the fourth channel structure CH4 may be arranged at regular intervals in the second direction X. The bitline contact 160 connected to the first channel structure CH1 may be shifted in a direction away from the string separation structure SC. On the contrary, the bitline contacts 160 connected to the second channel structure CH2 and fourth channel structure CH4 may not be shifted. Thus, a distance S11 between the bitline contacts 160 connected to the first channel structure CH1 and second channel structure CH2 may be smaller than a distance S12 between the bitline contacts 160 connected to the first channel structure CH1 and fourth channel structure CH4.

In some embodiments, some of the shifted bitline contacts 160 may be in contact with the stopper line DL. For example, as illustrated in FIG. 6B, the first bitline contact 160a may be in contact with the top surface of the stopper line DL through the first interlayer insulating film 140 and second interlayer insulating film 141. The first bitline contact 160a may be in contact not only with the top surface of the first channel structure CH1, but also with part of the side surface of the first channel structure CH1. For example, the first bitline contact 160a may be in contact with the side surface of the channel pad 136.

The gate electrodes (ECL, GSL, WL11 through WL1n, WL21 through WL2n, and SSL) may be connected to gate contacts 162, in the extension region EXT. In FIG. 4, only the right-most of the gate contacts 162 is labelled, though the similar shapes to the left which have increasingly-higher lower surfaces to the left are also gate contacts 162 in this FIG. For example, the gate contacts 162 may penetrate the first interlayer insulating film 140 through fifth interlayer insulating film 144 to be connected to the gate electrodes (ECL, GSL, WL11 through WL1n, WL21 through WL2n, and SSL), as shown in FIG. 4.

The source structure 105 may be connected to a source contact 164. For example, the source contact 164 may penetrate the first interlayer insulating film 140 through fifth interlayer insulating film 144 to be connected to the source structure 105.

The gate contacts 162 and/or the source contact 164 may be connected to connecting wires 170 on the fifth interlayer insulating film 144. The connecting wires 170 may be electrically connected to the gate electrodes (ECL, GSL, WL11 through WL1n, WL21 through WL2n, and SSL) through the gate contacts 162 and to the source structure 105 through the source contact 164.

The bitlines BL and/or the connecting wires 170 may be connected to first wire structures (180 and 185). For example, a sixth interlayer insulating film 145 may be formed on the fifth interlayer insulating film 144. The first wire structures (180 and 185) may be formed in the sixth interlayer insulating film 145 to be electrically connected to the bitlines BL and/or the connecting wires 170.

The second substrate 200 may be disposed below the first substrate 100. For example, the top surface of the second substrate 200 may face the bottom surface of the first substrate 100. The second substrate 200 may include, for example, a semiconductor substrate such as a silicon substrate, a germanium substrate, or a silicon-germanium substrate. Alternatively, the second substrate 200 may include an SOI substrate or a GOI substrate.

The peripheral circuit elements PT may be formed on the second substrate 200. The peripheral circuit elements PT may form, for example, the peripheral circuit 30 of FIG. 1, which controls the operation of the semiconductor memory device according to some embodiments of the present disclosure. For example, the peripheral circuit elements PT may include the control logic 37, the row decoder 33, and the page buffer 35 of FIG. 1. In the description that follows, the surface of the second substrate 200 where the peripheral circuit elements PT are disposed may be referred to as the front side of the second substrate 200, and the surface of the second substrate 200 that is opposite to the front side of the second substrate 200 may be referred to as the back side of the second substrate 200.

The peripheral circuit elements PT may include, for example, transistors, but the present disclosure is not limited thereto. That is, the peripheral circuit elements PT may not only include various active elements such as transistors, but also include various passive elements such as capacitors, resistors, or inductors.

In some embodiments, the back side of the first substrate 100 may face the front side of the second substrate 200. For example, a seventh interlayer insulating film 240, which covers the peripheral circuit elements PT, may be formed on the front side of the second substrate 200. The first substrate 100 may be deposited on the top surface of the seventh interlayer insulating film 240.

In some embodiments, the first wire structures (180 and 185) may be connected to the peripheral circuit elements PT through the through plugs 166. For example, second wire structures 260, which are connected to the peripheral circuit elements PT, may be formed in the seventh interlayer insulating film 240. The through plugs 166 may connect the first wire structures (180 and 185) and the second wire structures 260. Accordingly, the bitlines BL, the gate electrodes (ECL, GSL, WL11 through WL1n, WL21 through WL2n, and SSL), and/or the source structure 105 may be electrically connected to the peripheral circuit elements PT.

To increase the integration density of the semiconductor memory device according to some embodiments of the present disclosure, the string separation structure SC may be formed to overlap with some of the channel structures CH. The string separation structure SC may narrow the space for the channel structures CH to be connected to the bitline contacts 160 and may thus cause defects.

For example, referring to FIG. 7A, as the first channel structure CH1 overlaps with the string separation structure SC, the space for the first channel structure CH1 may be narrow, and as a result, the first bitline contact 160a may also overlap with the string separation structure SC and may thus be connected to the first channel structure CH1. In this case, the first bitline contact 160a may further extend along the string separation structure SC. For example, an etching process for forming the first bitline contact 160a may over-etch the string separation structure SC. For example, the first bitline contact 160a may be placed in contact with the side surface of the uppermost gate electrode, i.e., the side surface of the string selection line SSL, and may thus cause a short circuit.

In another example, referring to FIG. 7B, to avoid overlapping with the string separation structure SC, the first bitline contact 160a may be spaced apart from the string separation structure SC and may be connected to the first channel structure CH1 at a distance from the first channel structure CH1. In this case, the first bitline contact 160a may penetrate the first interlayer insulating film 140 and second interlayer insulating film 141. For example, the etching process for forming the first bitline contact 160a may etch parts of the first interlayer insulating film 140 and second interlayer insulating film 141 that are adjacent to the side surface of the first channel structure CH1. As a result, the first bitline contact 160a may be placed in contact with the top surface of the uppermost gate electrode, i.e., the top surface of the string selection line SSL, and may thus cause a short circuit.

However, as the semiconductor memory device according to some embodiments of the present disclosure is provided with the stopper line DL, defects can be prevented. Specifically, as already mentioned above, the stopper line DL may be deposited on the gate electrodes (ECL, GSL, WL11 through WL1n, WL21 through WL2n, and SSL). The stopper line DL can function as an etch stopper during an etching process for forming the bitline contacts 160 and can thus prevent the bitline contacts 160 from being placed in contact with the gate electrodes (ECL, GSL, WL11 through WL1n, WL21 through WL2n, and SSL). For example, as illustrated in FIG. 6B, even though the first bitline contact 160a is apart from the string separation structure SC, as illustrated in FIG. 6B, the stopper line DL can prevent the first bitline contact 160a from being placed in contact with the string selection line SSL. Accordingly, a semiconductor memory device with an improved product reliability and improved process margins can be provided.

Figure 8:
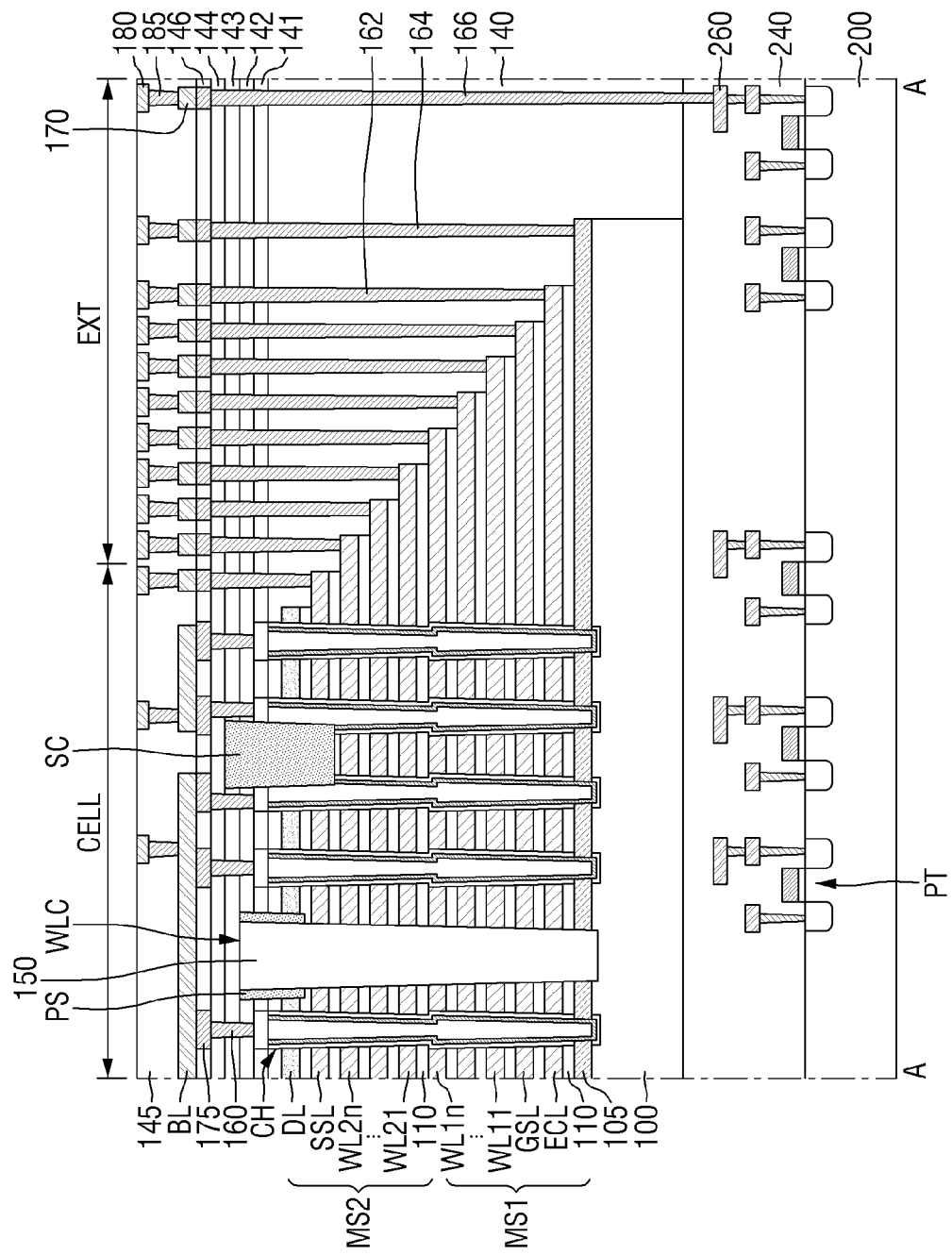
FIG. 8 and FIG. 9 are cross-sectional views illustrating semiconductor memory devices according to some embodiments of the present disclosure.
Figure 9:
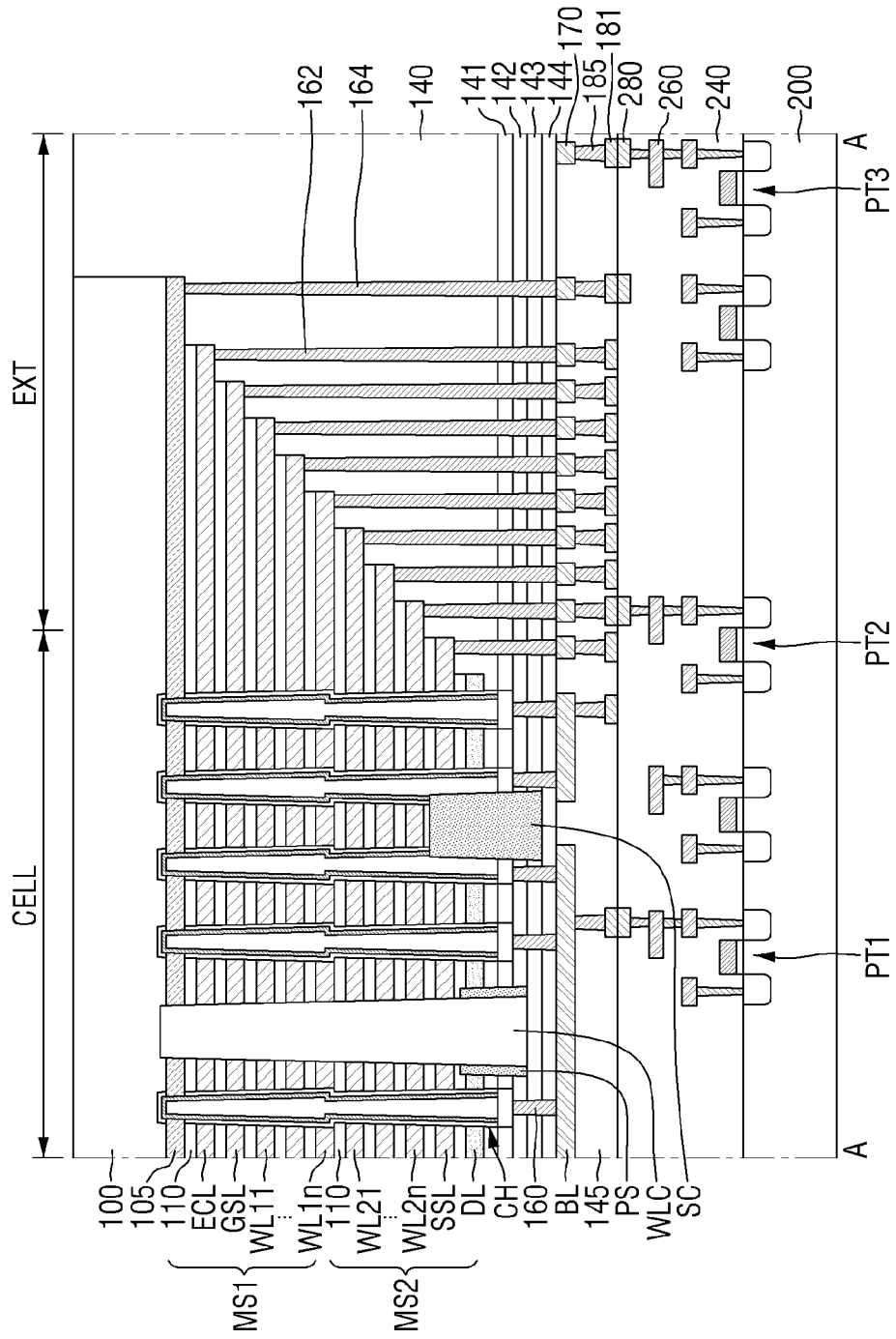

FIG. 8 and FIG. 9 are cross-sectional views illustrating semiconductor memory devices according to some embodiments of the present disclosure. For convenience, the embodiments of FIG. 8 and FIG. 9 will hereinafter be described, focusing mainly on the differences with the embodiments of FIG. 1 through FIG. 7B.

Referring to FIG. 8, the semiconductor memory device according to some embodiments of the present disclosure further includes contact studs 175.

The contact studs 175 may be interposed between bitline contacts 160 and bitlines BL. For example, an eighth interlayer insulating film 146 may be formed between fifth interlayer insulating film 144 and sixth interlayer insulating film 145. The contact studs 175 may be formed in the eighth interlayer insulating film 146 and may connect the bitline contacts 160 and the bitlines BL.

The contact studs 175 can improve the contact reliability between shifted bitline contacts 160 and the bitlines BL. For example, the contact studs 175 can improve the contact reliability with respect to the bitline contacts 160 by increasing the areas of contact with the shifted bitline contacts 160.

In some embodiments, the contact studs 175 may connect gate contacts 162 and/or a source contact 164 to connecting wires 170.

Referring to FIG. 9, the front side of a first substrate 100 may face the front side of a second substrate 200.

For example, the semiconductor memory device according to some embodiments of the present disclosure may have a chip-to-chip (C2C) structure. The C2C structure refers to a structure obtained by fabricating an upper chip including a cell area on a first wafer (e.g., a first substrate 100), fabricating a lower chip including a peripheral circuit region on a second wafer (e.g., a second substrate 200), which is different from the first wafer, and bonding the upper and lower chips together.

For example, the upper and lower chips may be bonded together by electrically connecting first bonding metals 181, which are formed in an uppermost metal layer of the upper chip, and second bonding metals 280, which are formed in an uppermost metal layer of the lower chip. For example, in a case where the first bonding metals 181 and the second bonding metals 280 are formed of copper (Cu), the upper and lower chips may be connected to each other via Cu—Cu bonding, but the present disclosure is not limited thereto. The first bonding metals 181 and the second bonding metals 280 may be formed of various other metals such as aluminum (Al) or tungsten (W).

As the first bonding metals 181 and the second bonding metals 280 are connected, first wire structures (180 and 185) may be connected to the second wire structures 260. As a result, gate electrodes (ECL, GSL, WL11 through WL1n, WL21 through WL2n, and SSL) and/or a source structure 105 can be electrically connected to peripheral circuit elements PT.

Figure 10:
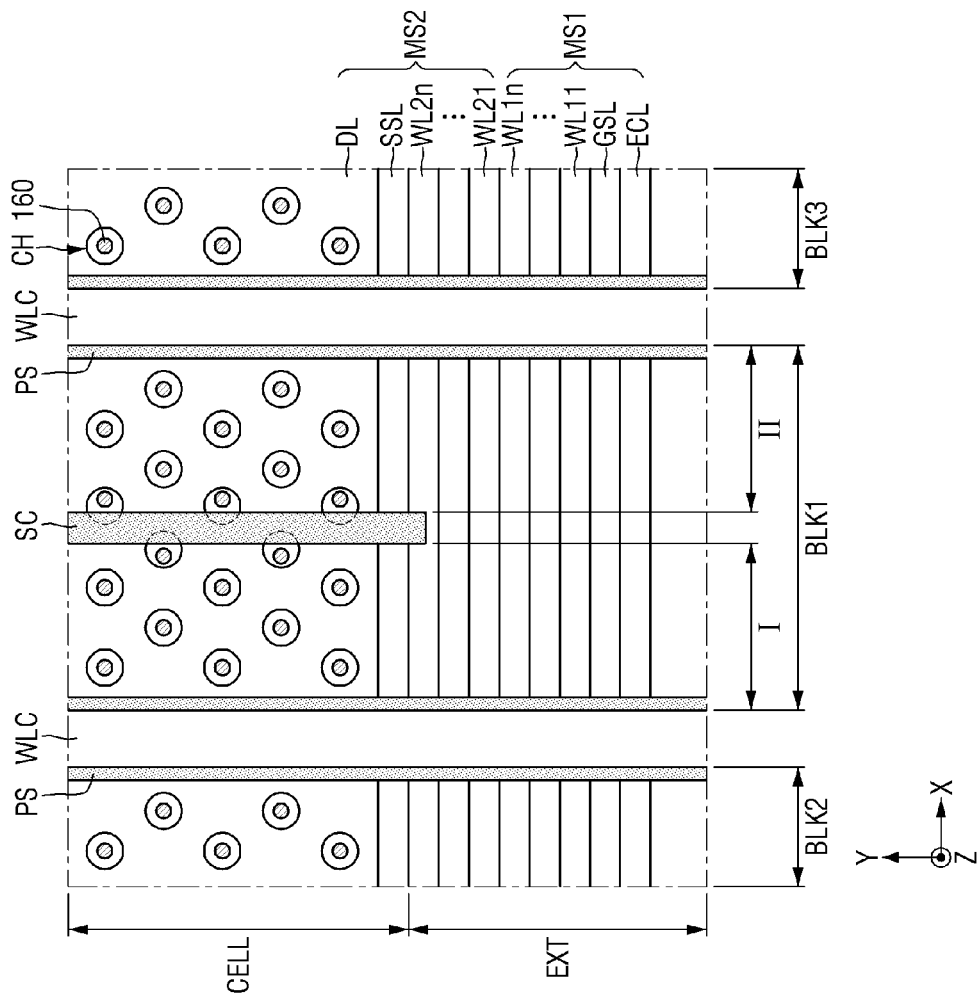
FIG. 10, FIG. 11 and FIG. 12 are layout views illustrating semiconductor memory devices according to some embodiments of the present disclosure.
Figure 11:
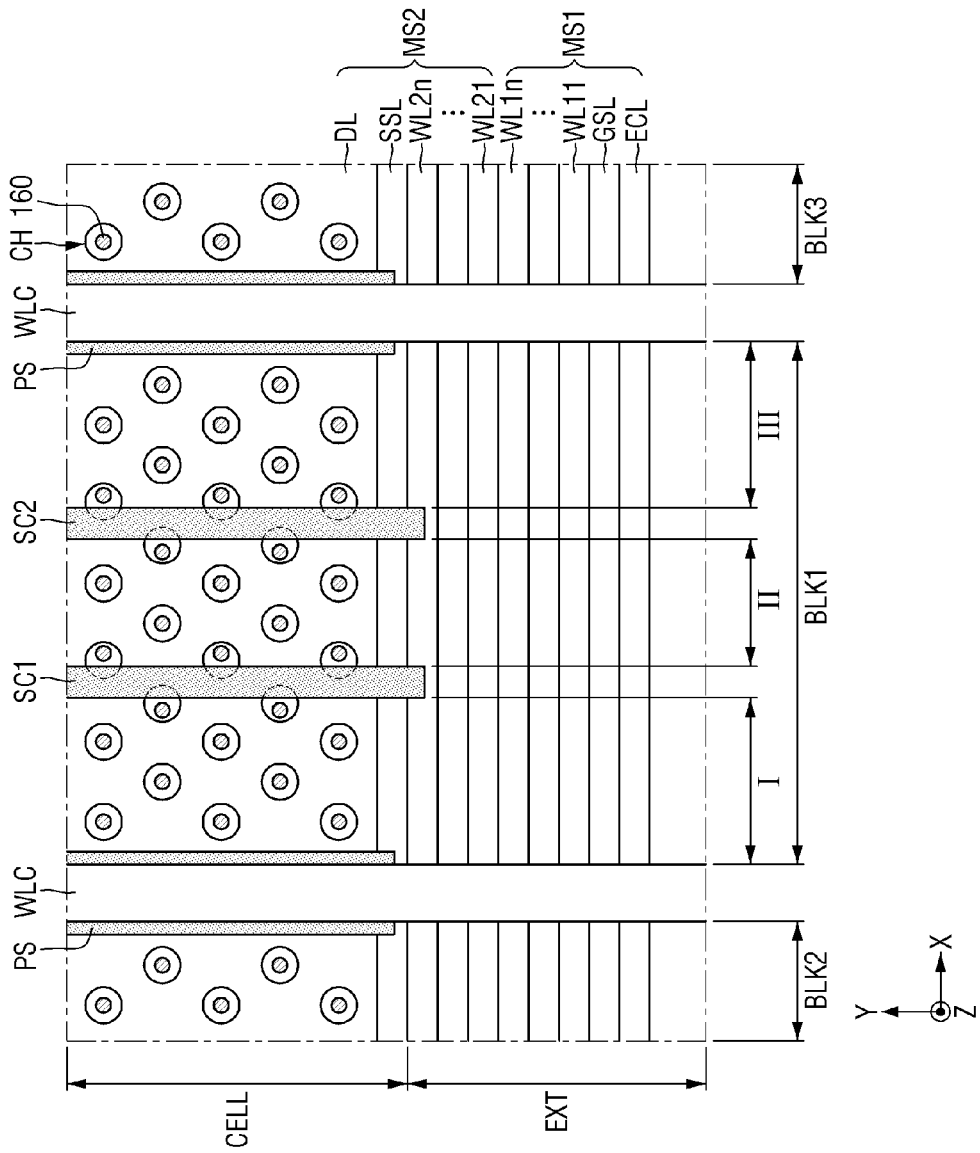
Figure 12:
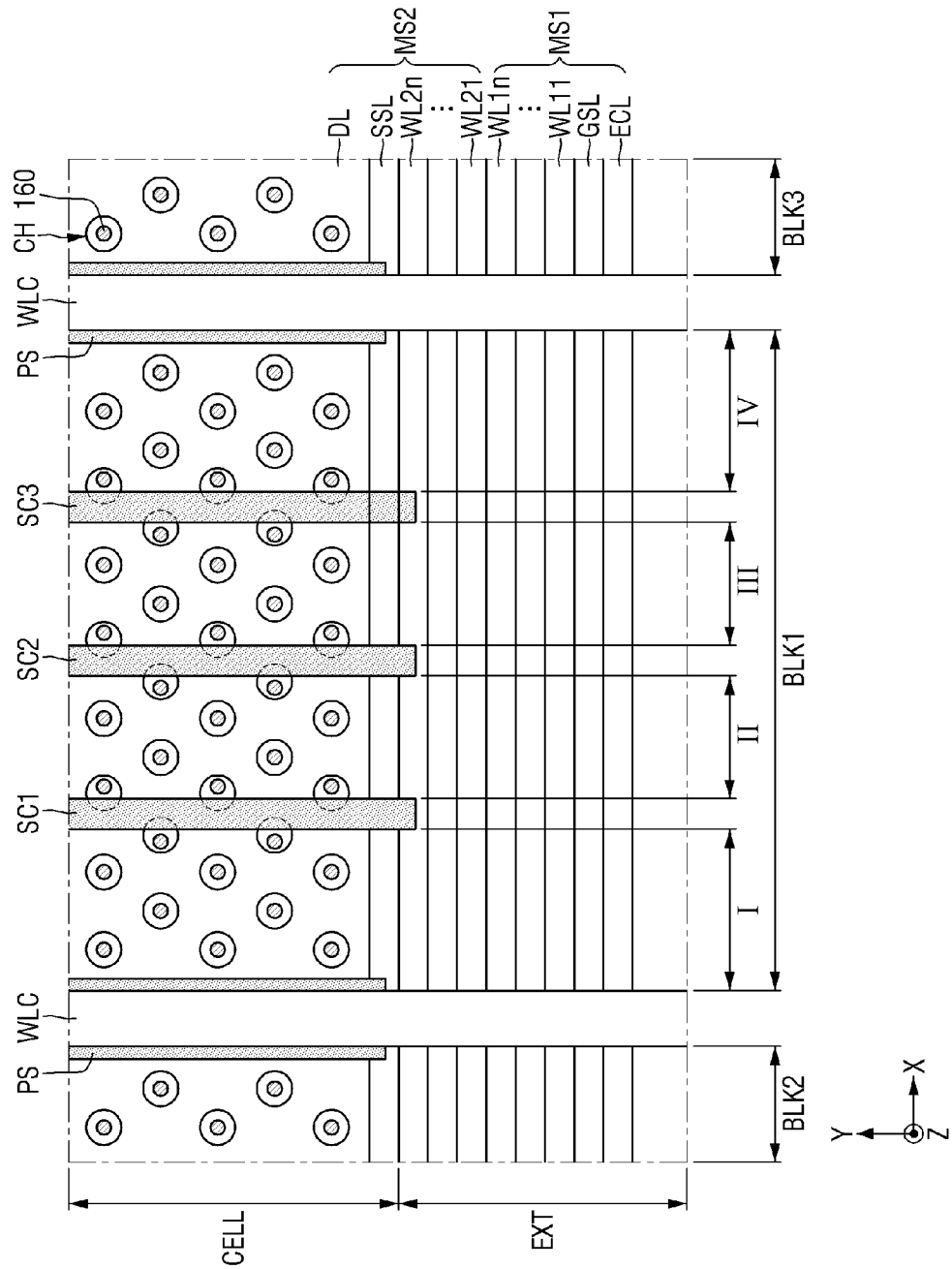

FIG. 10, FIG. 11 and FIG. 12 are layout views illustrating semiconductor memory devices according to some embodiments of the present disclosure. For convenience, the embodiments of FIG. 10 through FIG. 12 will hereinafter be described, focusing mainly on the differences with the embodiments of FIG. 1 through FIG. 9.

Referring to FIG. 10, protective structures PS may extend across both a cell array region CELL and an extension region EXT.

For example, the protective structures PS may extend in a first direction Y along sides of each of block separation areas WLC. As gate electrodes (ECL, GSL, WL11 through WL1n, WL21 through WL2n, and SSL) are stacked in a stepwise fashion in the extension region EXT, the protective structures PS may not separate the gate electrodes (ECL, GSL, WL11 through WL1n, WL21 through WL2n, and SSL) from the block separation areas WLC.

Referring to FIG. 11, the semiconductor memory device according to some embodiments of the present disclosure includes first string separation structure SC1 and second string separation structure SC2.

For example, in a first memory cell block BLK1, 12 channel structures CH may be arranged in a zigzag fashion in a first direction Y. The first string separation structure SC1 and second string separation structure SC2 may be spaced apart from each other in a second direction X and may cut a string selection line SSL. As a result, the first string separation structure SC1 and second string separation structure SC2 may define first string area I through third string area III, which are sequentially arranged in the second direction X, in the first memory cell block BLK1.

Each of the first string separation structure SC1 and second string separation structure SC2 may overlap with at least some of the channel structures CH. Bitline contacts 160 disposed near the first or second string separation structure SC1 or SC2 may overlap with at least some of the channel structures CH. The bitline contacts 160 disposed near the first or second string separation structure SC1 or SC2 may be shifted in a direction away from the first or second string separation structure SC1 or SC2. The first string separation structure SC1 and second string separation structure SC2 are similar to the string separation structure SC of FIG. 3A through FIG. 6B, and thus, detailed descriptions thereof will be omitted.

Referring to FIG. 12, the semiconductor memory device according to some embodiments of the present disclosure includes first string separation structures SC1 through third string separation structure SC3.

For example, in a first memory cell block BLK1, 16 channel structures CH may be arranged in a zigzag fashion in a first direction Y. The first string separation structures SC1 through third string separation structure SC3 may be spaced apart from one another in a second direction X and may cut a string selection line SSL. As a result, the first string separation structures SC1 through third string separation structure SC3 may define first string area I through fourth string area IV, which are sequentially arranged in the second direction X, in the first memory cell block BLK1.

Each of the first string separation structures SC1 through third string separation structure SC3 may overlap with at least some of the channel structures CH. Bitline contacts 160 disposed near the first string separation structure SC1, the second string separation structure SC2, or the third string separation structure SC3 may be shifted in a direction away from the first string separation structure SC1, the second string separation structure SC2, or the third string separation structure SC3. The first string separation structures SC1 through third string separation structure SC3 are similar to the string separation structure SC of FIG. 3A through FIG. 6B, and thus, detailed descriptions thereof will be omitted.

Figure 13:
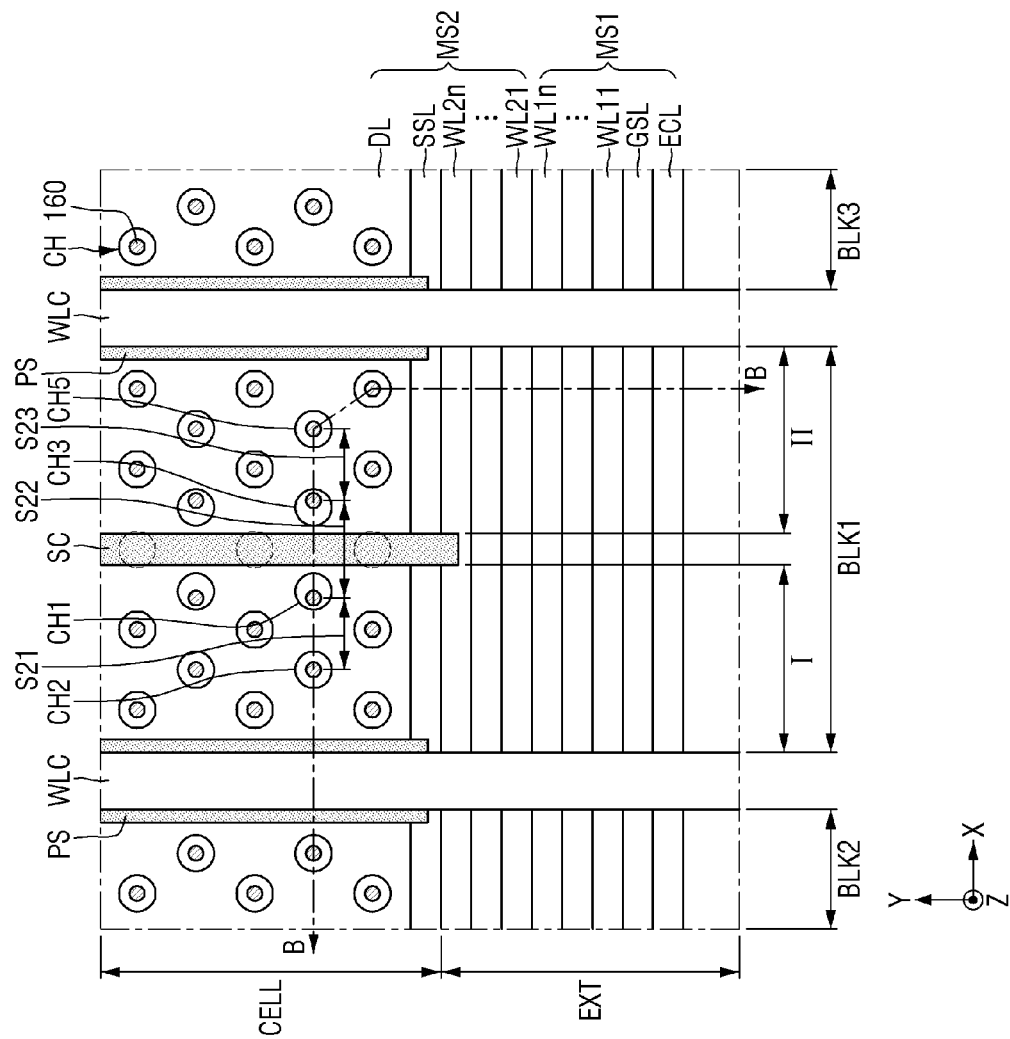
FIG. 13 is a layout view illustrating a semiconductor memory device according to some embodiments of the present disclosure.
Figure 14:
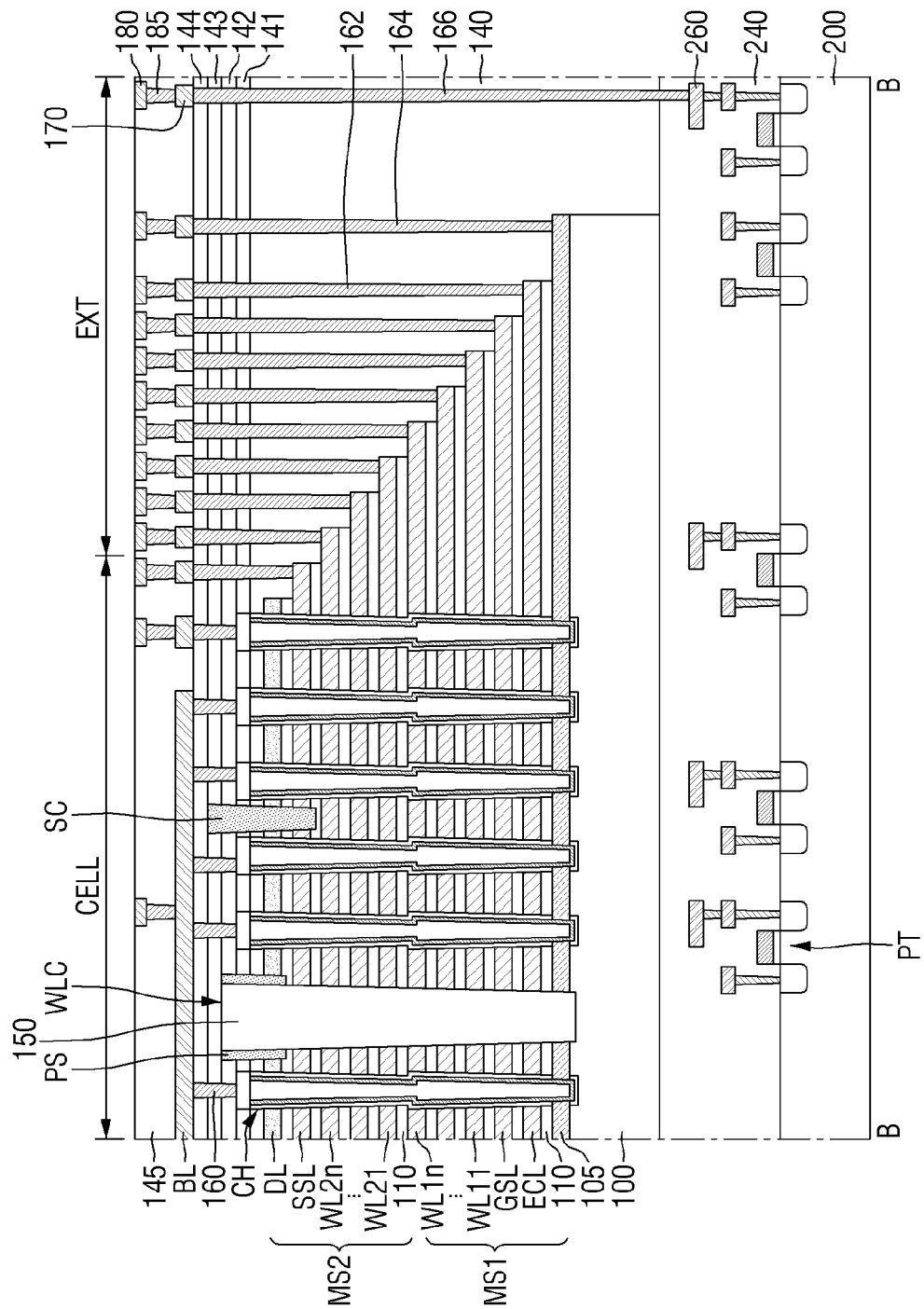
FIG. 14 is a cross-sectional view taken along line B-B of FIG. 13.

FIG. 13 is a layout view illustrating a semiconductor memory device according to some embodiments of the present disclosure. FIG. 14 is a cross-sectional view taken along line B-B of FIG. 13. For convenience, the embodiment of FIG. 13 and FIG. 14 will hereinafter be described, focusing mainly on the differences with the embodiments of FIGS. 1 through 12.

Referring to FIG. 13 and FIG. 14, a string separation structure SC does not overlap with channel structures CH.

For example, first channel structure CH1 and third channel structure CH3 may be disposed closer than the other channel structures CH to the string separation structure SC. The first channel structure CH1 and third channel structure CH3 may be spaced apart from the string separation structure SC. That is, the first channel structure CH1 and third channel structure CH3 may not be in contact with the string separation structure SC.

Bitline contacts 160 disposed near the string separation structure SC may be shifted in a direction away from the string separation structure SC. For example, each of first bitline contact 160a and third bitline contact 160c connected to the first channel structure CH1 and third channel structure CH3, respectively, may be shifted in a direction away from the string separation structure SC. As the string separation structure SC is interposed between the first channel structure CH1 and third channel structure CH3, the first bitline contact 160a and third bitline contact 160c may be shifted in opposite directions.

In some embodiments, as some of the bitline contacts 160 are shifted, at least some of the bitline contacts 160 may not be arranged at regular intervals. For example, as illustrated in FIG. 13, the first channel structure CH1 and a second channel structure CH2 may be disposed on one side of the string separation structure SC (e.g., in a first string area I), and the third channel structure CH3 and a fifth channel structure CH5 may be disposed on the other side of the string separation structure SC (e.g., in a second string area II). The first channel structure CH1, the second channel structure CH2, the third channel structure CH3, and the fifth channel structure CH5 may be arranged at regular intervals in the second direction X. In FIG. 13, the bitline contacts 160 connected to the first channel structure CH1 and third channel structure CH3 may be shifted in their respective directions away from the string separation structure SC. On the contrary, in FIG. 13 bitline contacts 160 connected to the second channel structure CH2 and fifth channel structure CH4 may not be shifted.

Accordingly, a distance S21 between the bitline contacts 160 connected to the first channel structure CH1 and second channel structure CH2 may be smaller than a distance S22 between the bitline contacts 160 connected to the first channel structure CH1 and third channel structure CH3. Also, a distance S23 between the bitline contacts 160 connected to the third channel structure CH3 and fifth channel structure CH5 may be smaller than the distance S22 between the bitline contacts 160 connected to the first channel structure CH1 and third channel structure CH3.

In some embodiments, dummy channel structures DCH, which have a similar shape to the channel structures CH, may be formed in a mold structure (MS1 and MS2) in a cell array region CELL. The dummy channel structures DCH may extend in a third direction Z and may penetrate the mold structure (MS1 and MS2).

In some embodiments, the dummy channel structures DCH may overlap with the string separation structure SC. For example, a plurality of dummy channel structures DCH that are arranged in a first direction Y to overlap with the string separation structure SC may be formed. The channel structures and the dummy channel structures DCH may be arranged at regular intervals and may thus reduce the stress applied to the mold structure (MS1 and MS2).

A method of fabricating a semiconductor memory device according to some embodiments of the present disclosure will hereinafter be described with reference to FIGS. 1 through 24.

FIG. 15 through FIG. 23 are cross-sectional views illustrating intermediate steps of a method of fabricating a semiconductor memory device according to some embodiments of the present disclosure. For convenience, the embodiment of FIG. 15 through FIG. 23 will hereinafter be described, focusing mainly on the differences with the embodiments of FIGS. 1 through 12.

Figure 15:
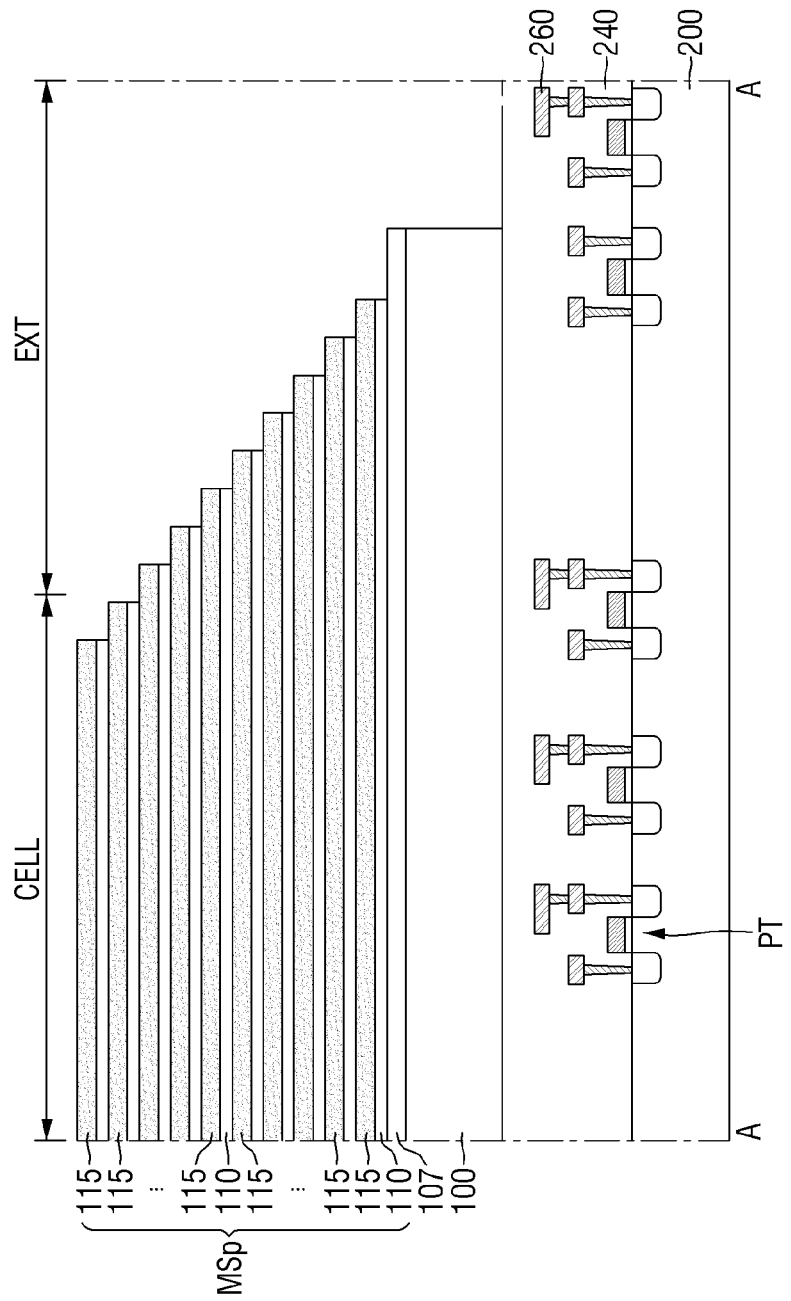
FIG. 15, FIG. 16, FIG. 17, FIG. 18, FIG. 19, FIG. 20, FIG. 21, FIG. 22, and FIG. 23 are cross-sectional views illustrating intermediate steps of a method of fabricating a semiconductor memory device according to some embodiments of the present disclosure.

Referring to FIG. 15, a first substrate 100 and a preliminary mold structure MSp are formed on a second substrate 200 and peripheral circuit elements PT.

The peripheral circuit elements PT may be formed on the front side of the second substrate 200. Also, a seventh interlayer insulating film 240, which covers the peripheral circuit elements PT, may be formed on the front side of the second substrate 200.

In some embodiments, the first substrate 100 may be stacked on the top surface of the seventh interlayer insulating film 240. That is, the back side of the first substrate 100 may face the front side of the second substrate 200.

The preliminary mold structure MSp may be formed on the front side of the first substrate 100. The preliminary mold structure MSp may include a plurality of first sacrificial films 115 and a plurality of mold insulating films 110, which are alternately stacked on the first substrate 100. In an extension region EXT, the first sacrificial films 115 may be stacked in a stepwise fashion. For example, the preliminary mold structure MSp may be patterned into a stepwise shape in the extension region EXT.

The first sacrificial films 115 may have a different etch selectivity from the mold insulating films 110. For example, the first sacrificial films 115 may include silicon nitride, silicon oxynitride, or polysilicon, and the mold insulating films 110 may include silicon oxide. Preferably, the first sacrificial films 115 may include silicon nitride or silicon oxynitride, and the mold insulating films 110 may include silicon oxide.

In some embodiments, a second sacrificial film 107 may be further formed on the entire front side of the first substrate 100. The preliminary mold structure MSp may be stacked on the top surface of the second sacrificial film 107. The second sacrificial film 107 may have a different etch selectivity from the mold insulating films 110. For example, the second sacrificial film 107 may include silicon nitride, silicon oxynitride, or polysilicon, and the mold insulating films 110 may include silicon oxide. Preferably, the second sacrificial film 107 may include silicon nitride or silicon oxynitride, and the mold insulating films 110 may include silicon oxide.

Figure 16:
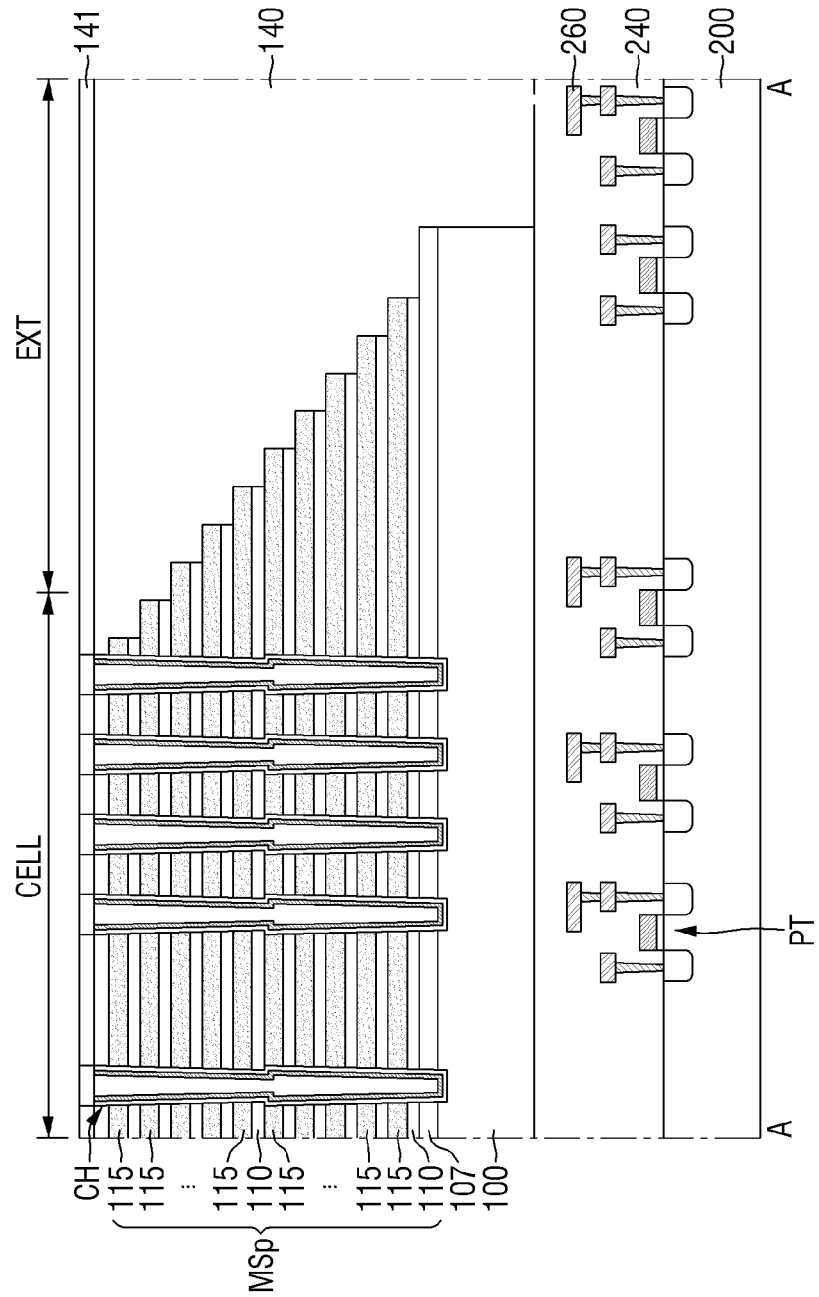

Referring to FIG. 16, channel structures CH are formed in the preliminary mold structure MSp.

For example, a first interlayer insulating film 140, which covers the first substrate 100 and the preliminary mold structure MSp, may be formed. Thereafter, the channel structures CH, which penetrate the first interlayer insulating film 140 and the preliminary mold structure MSp, may be formed. The channel structures CH may extend in a vertical direction that intersects the front side of the first substrate 100 and may thus penetrate the preliminary mold structure MSp. Thus, the channel structures CH may intersect the first sacrificial films 115.

In some embodiments, the channel structures CH may further include channel pads 136. The channel pads 136 may be formed to be connected to semiconductor patterns 130. For example, a second interlayer insulating film 141 may be formed on the first interlayer insulating film 140. The channel pads 136 may be formed in the second interlayer insulating film 141 and may be connected to the tops of the semiconductor patterns 130.

Figure 17:
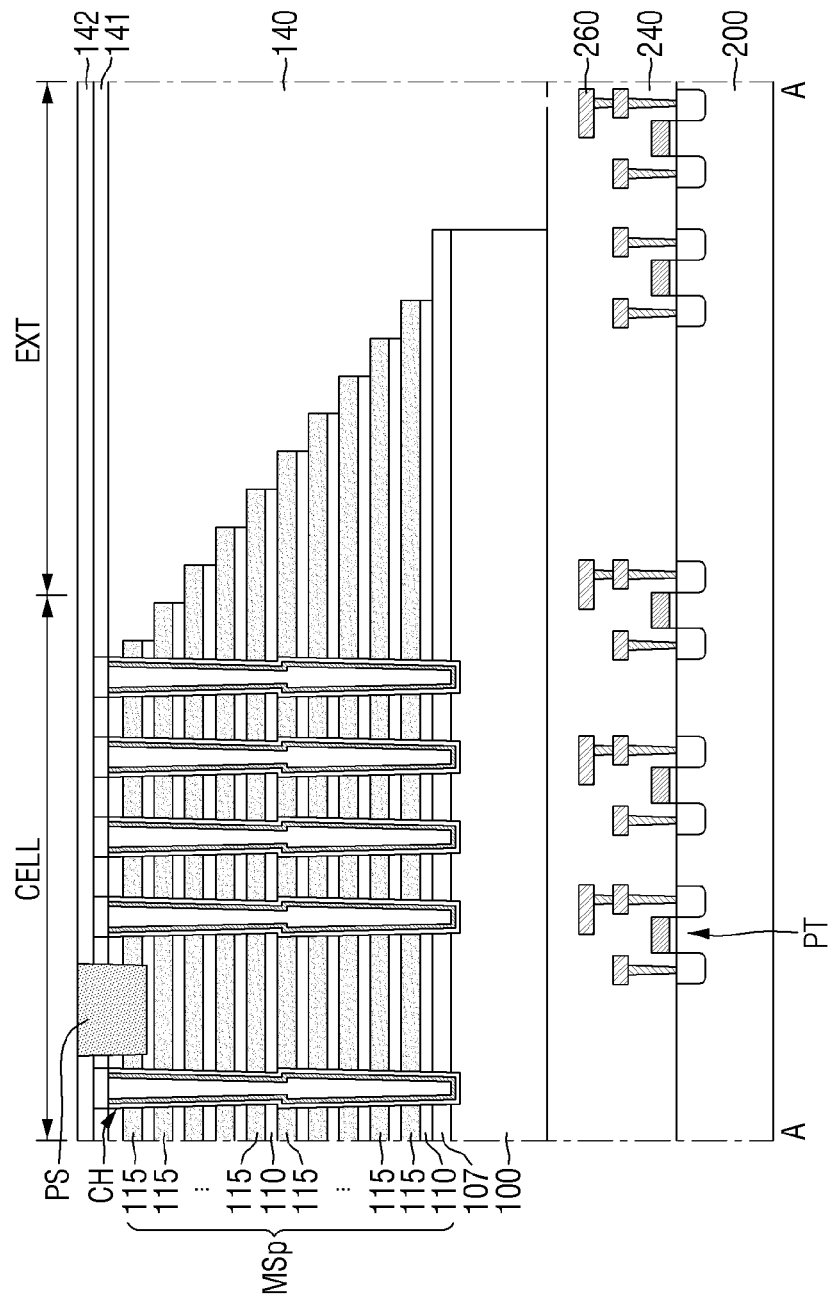

Referring to FIG. 17, a protective structure PS is formed.

The protective structure PS may cut the uppermost first sacrificial film 115. For example, a third interlayer insulating film 142, which covers the second interlayer insulating film 141, may be formed. Thereafter, the protective structure PS, which penetrates the second interlayer insulating film 141, the first interlayer insulating film 140, and the uppermost first sacrificial film 115, may be formed.

The protective structure PS may have a different etch selectivity from the first sacrificial films 115. For example, the protective structure PS may include silicon oxide, and the first sacrificial films 115 may include silicon nitride, silicon oxynitride, or polysilicon. Preferably, the protective structure PS may include silicon oxide, and the first sacrificial films 115 may include silicon nitride or silicon oxynitride.

Figure 18:
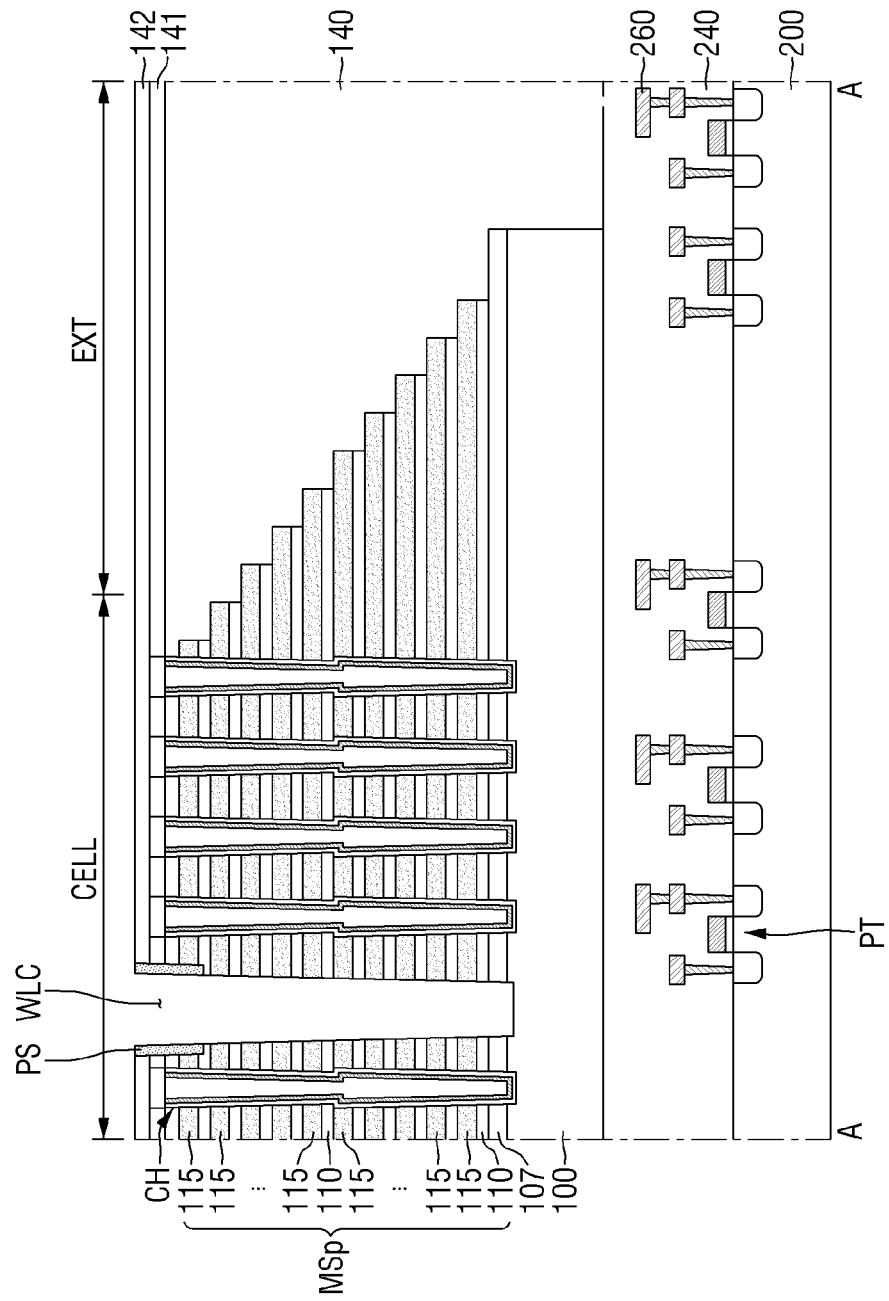

Referring to FIG. 18, a block separation area WLC is formed in the preliminary mold structure MSp.

The block separation area WLC may cut the preliminary mold structure MSp. As a result, the first sacrificial films 115 of the preliminary mold structure MSp may be exposed by the block separation area WLC.

The block separation area WLC may be formed to overlap with the protective structure PS. That is, the block separation area WLC may cut the protective structure PS. The cut protective structure PS may be interposed between the block separation area WLC and a stopper line DL. Accordingly, the uppermost first sacrificial film 115 may not be exposed by the block separation area WLC.

In some embodiments, the block separation area WLC may cut the second sacrificial film 107. As a result, the second sacrificial film 107 may be exposed by the block separation area WLC.

Figure 19:
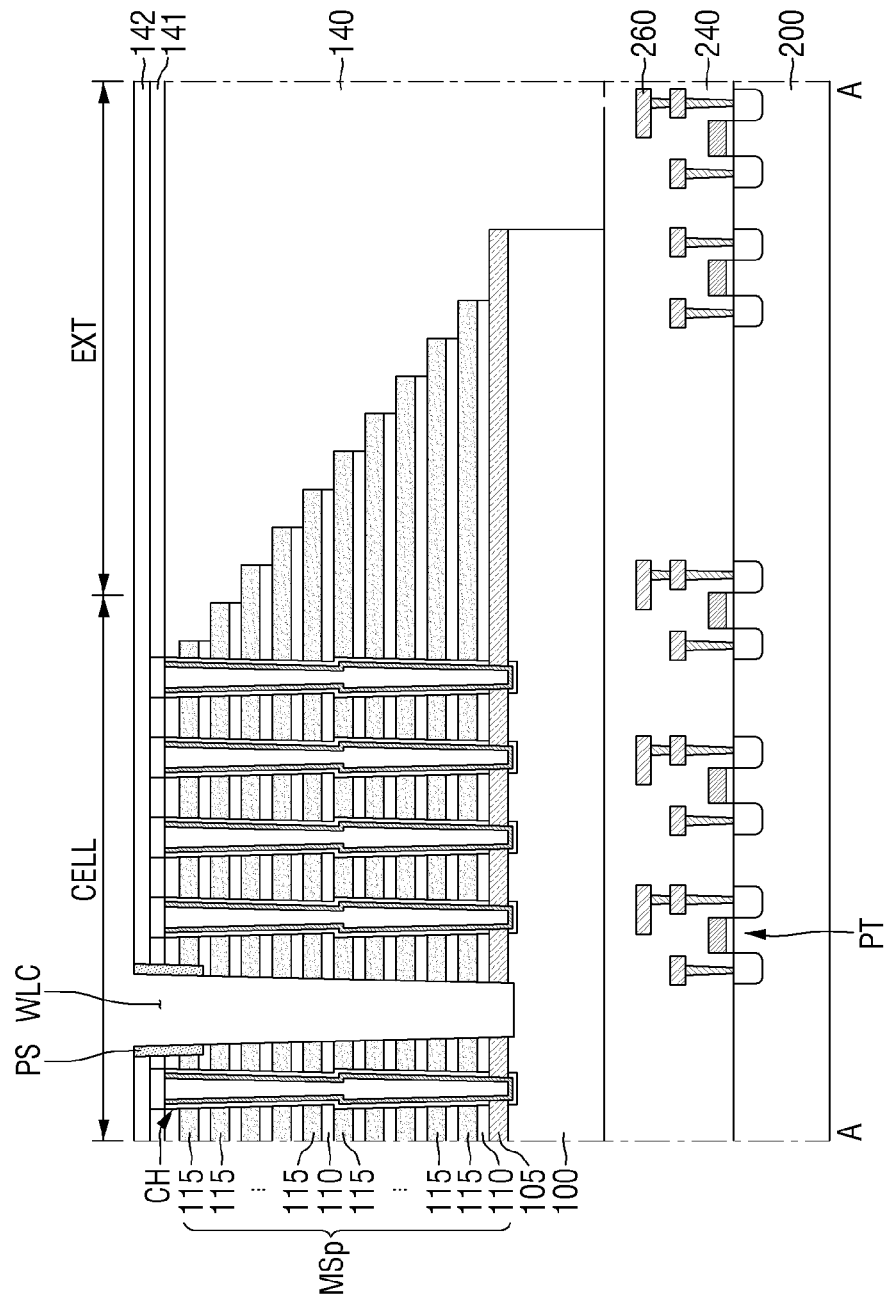

Referring to FIG. 19, a source structure 105 is formed.

For example, a first etching process that removes at least part of the second sacrificial film 107 exposed by the block separation area WLC and thereby exposes at least parts of the side surfaces of the channel structures CH may be performed. The first etching process may include, for example, a wet etching process using a phosphoric acid solution as an etchant, but the present disclosure is not limited thereto.

Thereafter, the source structure 105 may be formed in a region where at least part of the second sacrificial film 107 is removed. That is, the second sacrificial film 107 may be replaced by the source structure 105. The source structure 105 may include, for example, a metal or polysilicon doped with impurities, but the present disclosure is not limited thereto.

Figure 20:
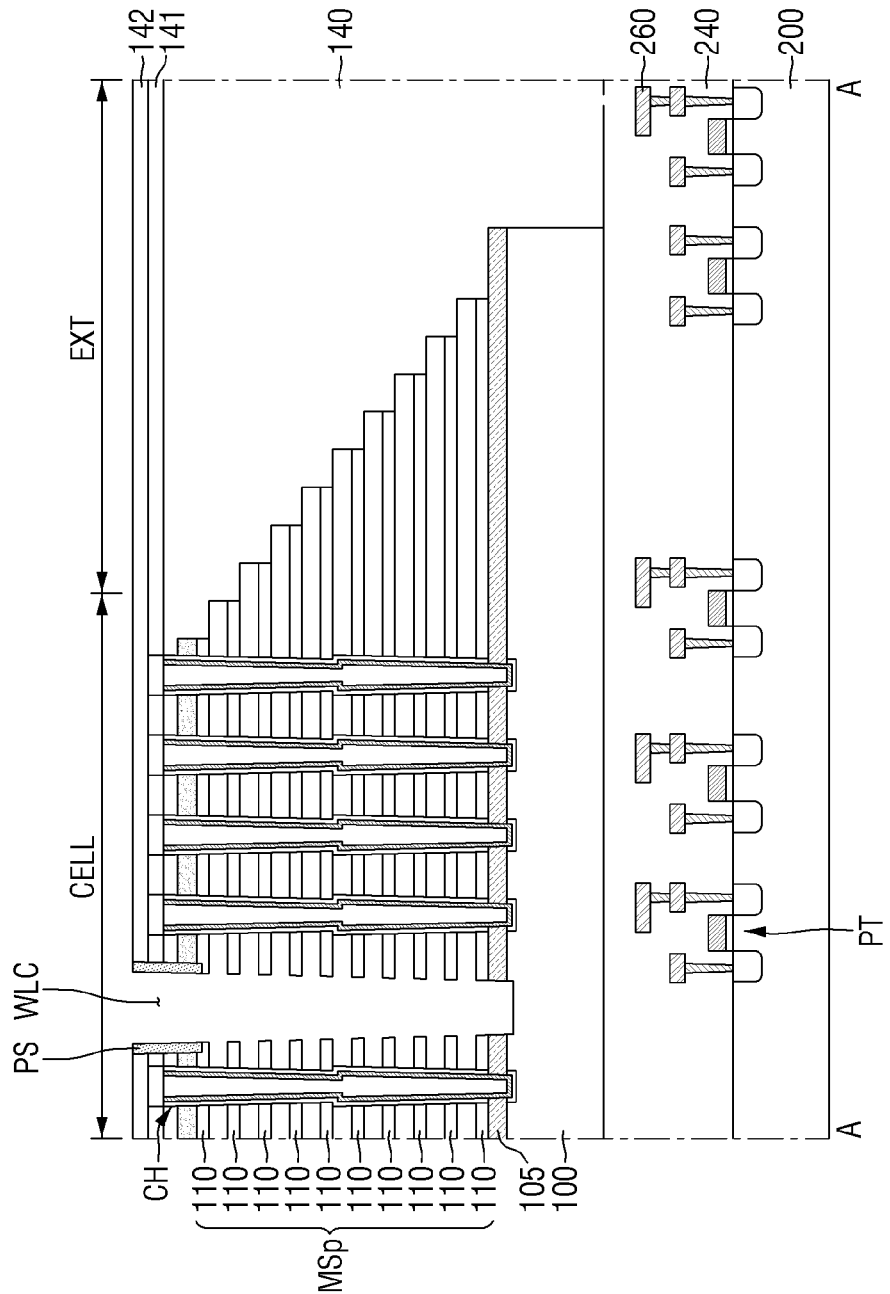

Referring to FIG. 20, first sacrificial films 115 exposed by the block separation area WLC are removed.

For example, a second etching process that removes the first sacrificial films 115 exposed by the block separation area WLC may be performed. The second etching process may include, for example, a wet etching process using a phosphoric acid solution as an etchant, but the present disclosure is not limited thereto.

As already mentioned above, due to the presence of the protective structure PS, the uppermost first sacrificial film 115 may not be exposed by the block separation area WLC. Also, as already mentioned above, the protective structure PS may have a different etch selectivity from the first sacrificial films 115. Thus, the protective structure PS can protect the uppermost first sacrificial film 115 from the second etching process.

Figure 21:
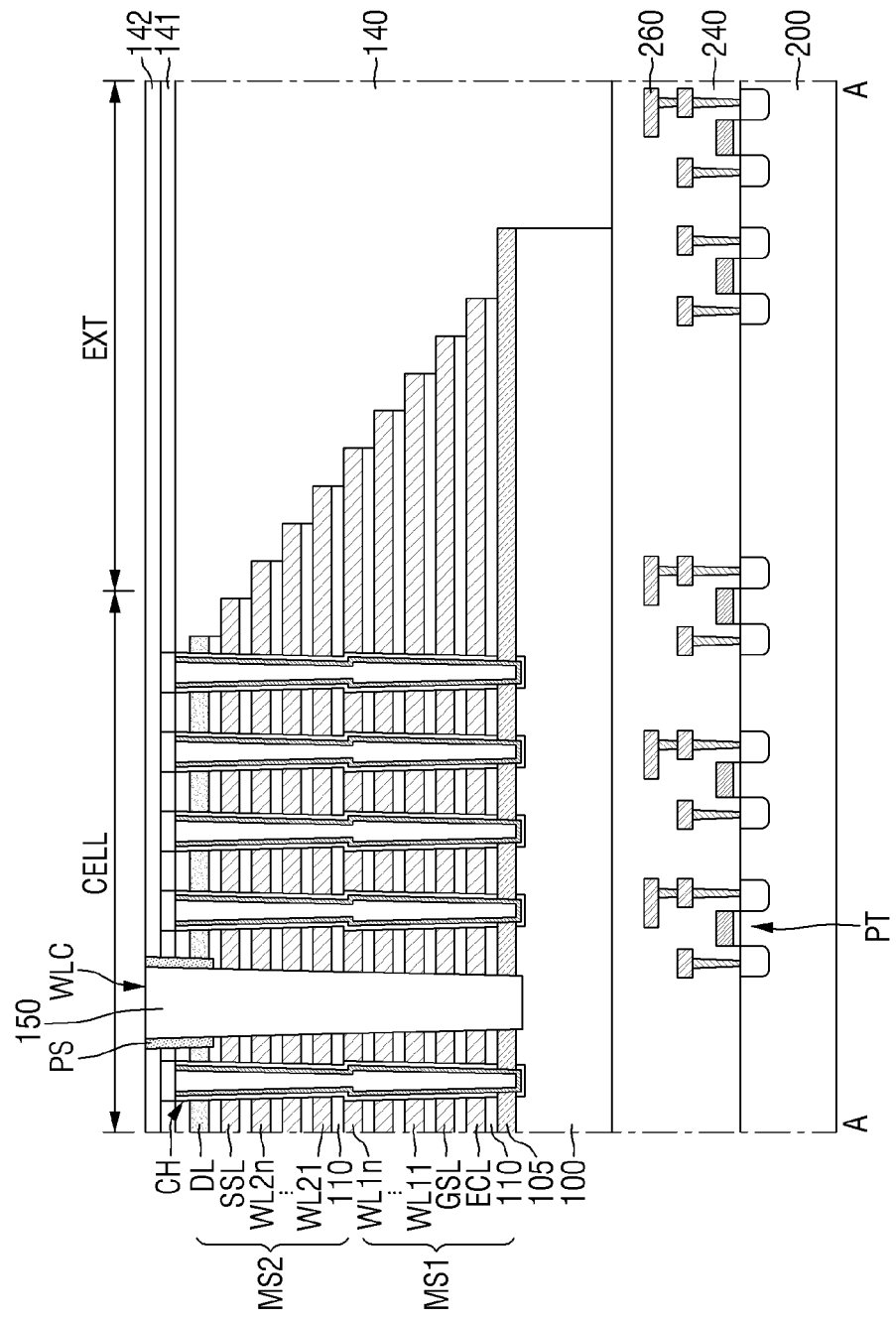

Referring to FIG. 21, gate electrodes (ECL, GSL, WL11 through WL1n, WL21 through WL2n, and SSL) are formed.

The gate electrodes (ECL, GSL, WL11 through WL1n, WL21 through WL2n, and SSL) may be formed in regions where the first sacrificial films 115 are removed. That is, the first sacrificial films 115 that are removed may be replaced by the gate electrodes (ECL, GSL, WL11 through WL1n, WL21 through WL2n, and SSL).

As already mentioned above, the uppermost first sacrificial films 115 can be protected by the protective structure PS and can thus remain unremoved. The uppermost first sacrificial film 115 may form the stopper line DL, which is stacked on the gate electrodes (ECL, GSL, WL11 through WL1n, WL21 through WL2n, and SSL).

In this manner, a mold structure (MS1 and MS2) including the gate electrodes (ECL, GSL, WL11 through WL1n, WL21 through WL2n, and SSL), the stopper line DL, and the mold insulating films 110, which are stacked on the first substrate 100, can be obtained.

Figure 22:
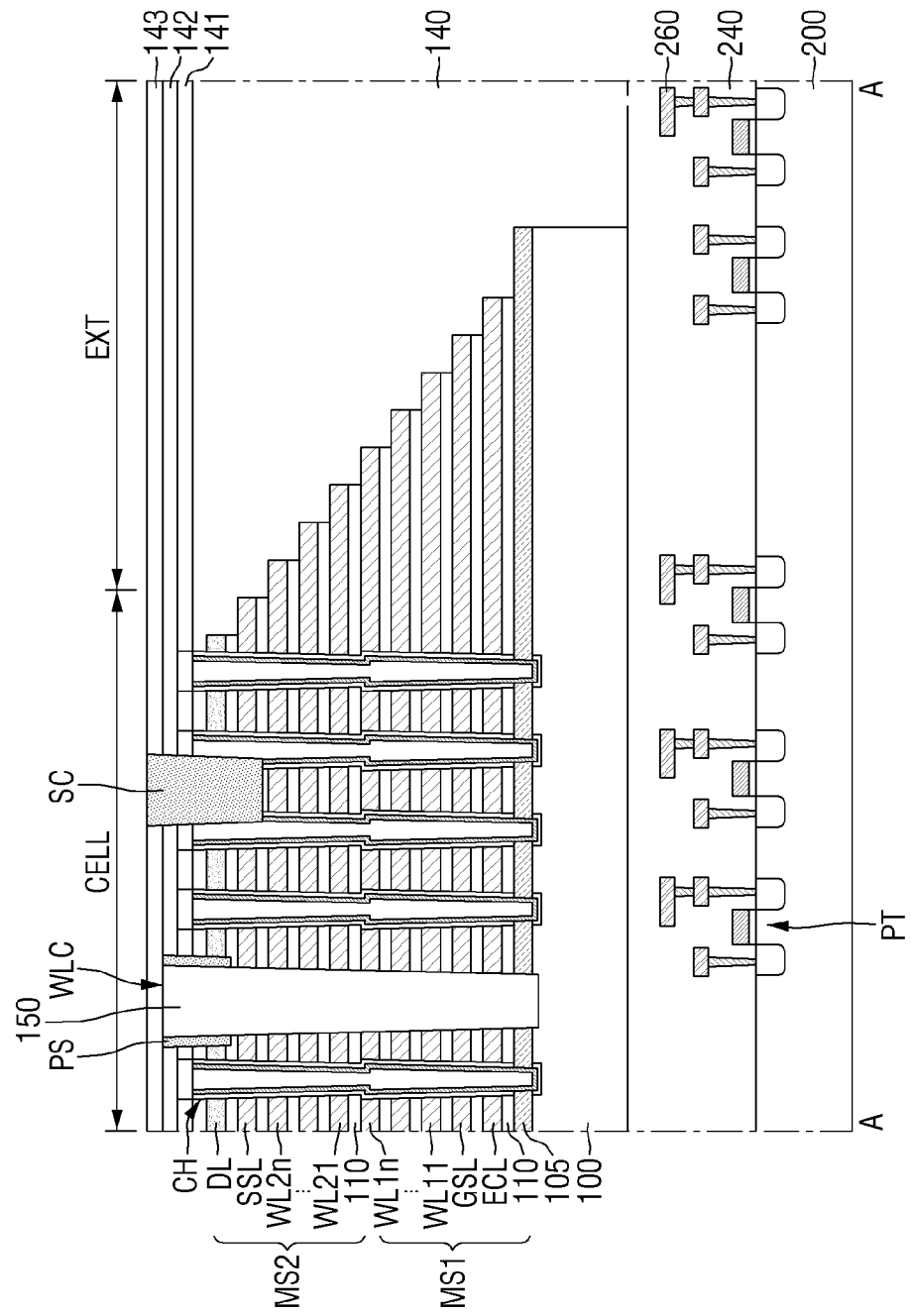

Referring to FIG. 22, a string separation structure SC is formed.

The string separation structure SC may cut a string selection line SSL. For example, a fourth interlayer insulating film 143 may be formed on the third interlayer insulating film 142. Thereafter, the string separation structure SC, which penetrates the third interlayer insulating film 142, the second interlayer insulating film 141, the first interlayer insulating film 140, and the string selection line SSL, may be formed.

The string separation structure SC may include an insulating material. For example, the string separation structure SC may include at least one of silicon oxide, silicon nitride, and silicon oxynitride, but the present disclosure is not limited thereto.

In some embodiments, the string separation structure SC may be formed to overlap with at least some of the channel structures CH.

Figure 23:
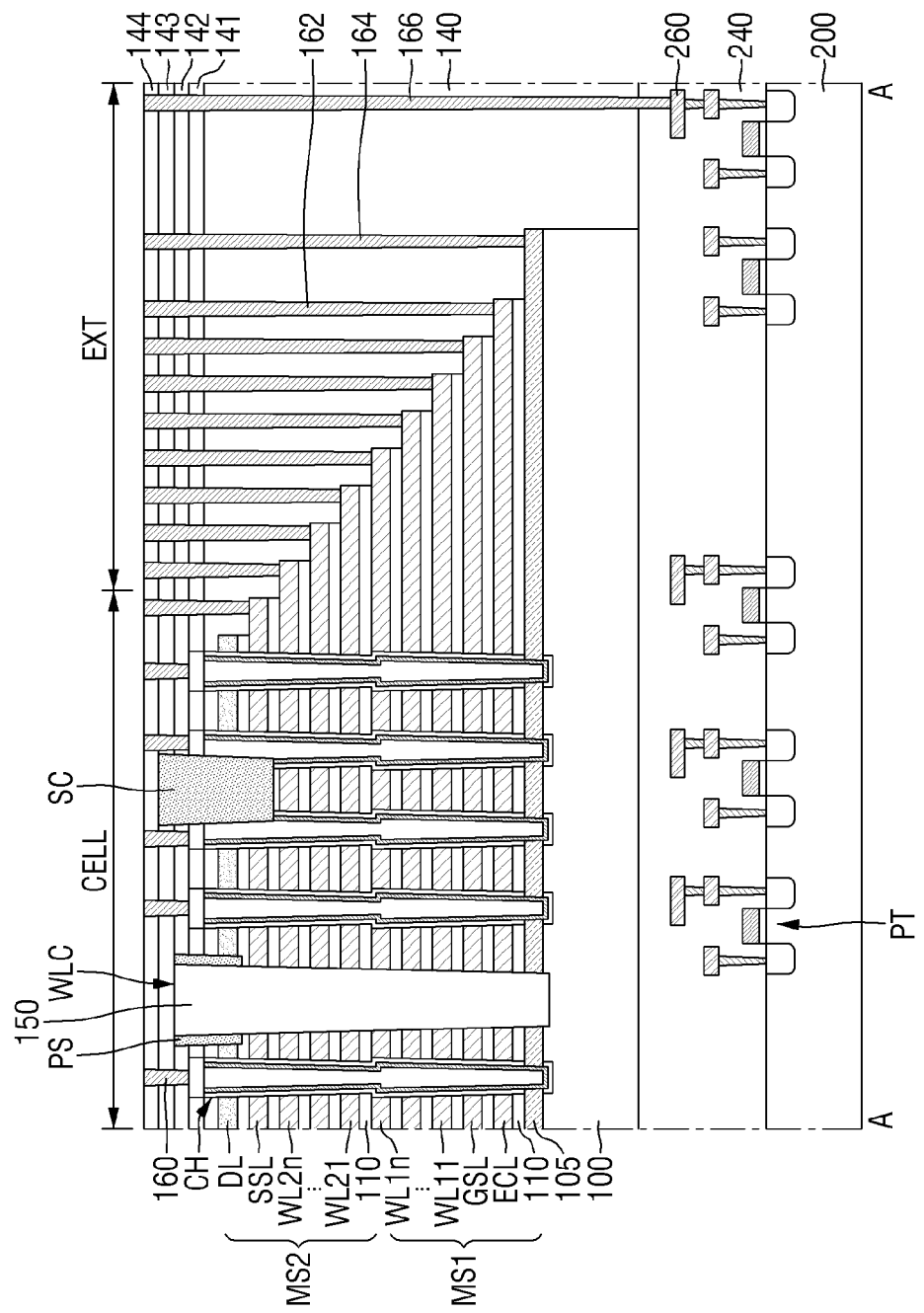

Referring to FIG. 23, bitline contacts 160, gate contacts 162, a source contact 164, and through plugs 166 are formed.

The bitline contacts 160 may be connected to the channel structures CH. For example, a fifth interlayer insulating film 144, which covers the fourth interlayer insulating film 143, may be formed. Thereafter, the bitline contacts 160, which are connected to the channel structures CH through the fourth interlayer insulating film 143 and fifth interlayer insulating film 144, may be formed.

In some embodiments, bitline contacts 160 disposed near the string separation structure SC may be shifted in a direction away from the string separation structure SC. The shifted bitline contacts 160 can improve the contact reliability with respect to the channel structures CH that overlap with the string separation structure SC. The stopper line DL can prevent the shifted bitline contacts 160 from being placed in contact with the string selection line SSL.

The gate contacts 162 may be connected to the gate electrodes (ECL, GSL, WL11 through WL1n, WL21 through WL2n, and SSL) through the first interlayer insulating film 140 through fifth interlayer insulating film 144.

The source contact 164 may be connected to the source structure through the first interlayer insulating film 140 through fifth interlayer insulating film 144.

The through plugs 166 may be connected to second wire structures 260. The through plugs 166 may be connected to the peripheral circuit elements PT through the second wire structures 260.

In some embodiments, at least some of the bitline contacts 160, the gate contacts 162, the source contact 164, and the through plugs 166 may be formed on the same level. The expression "on the same level", as used herein, means that elements are formed by the same manufacturing process, and may have one or more dimensional extremities (e.g., a top and/or bottom) that is/are coplanar or substantially coplanar.

Thereafter, referring to FIG. 4, bitlines BL, connecting wires 170, and a first wire structure (180 and 185) are formed. Accordingly, a method of manufacturing a semiconductor memory device with an improved product reliability and process margins can be provided.

Figure 24:
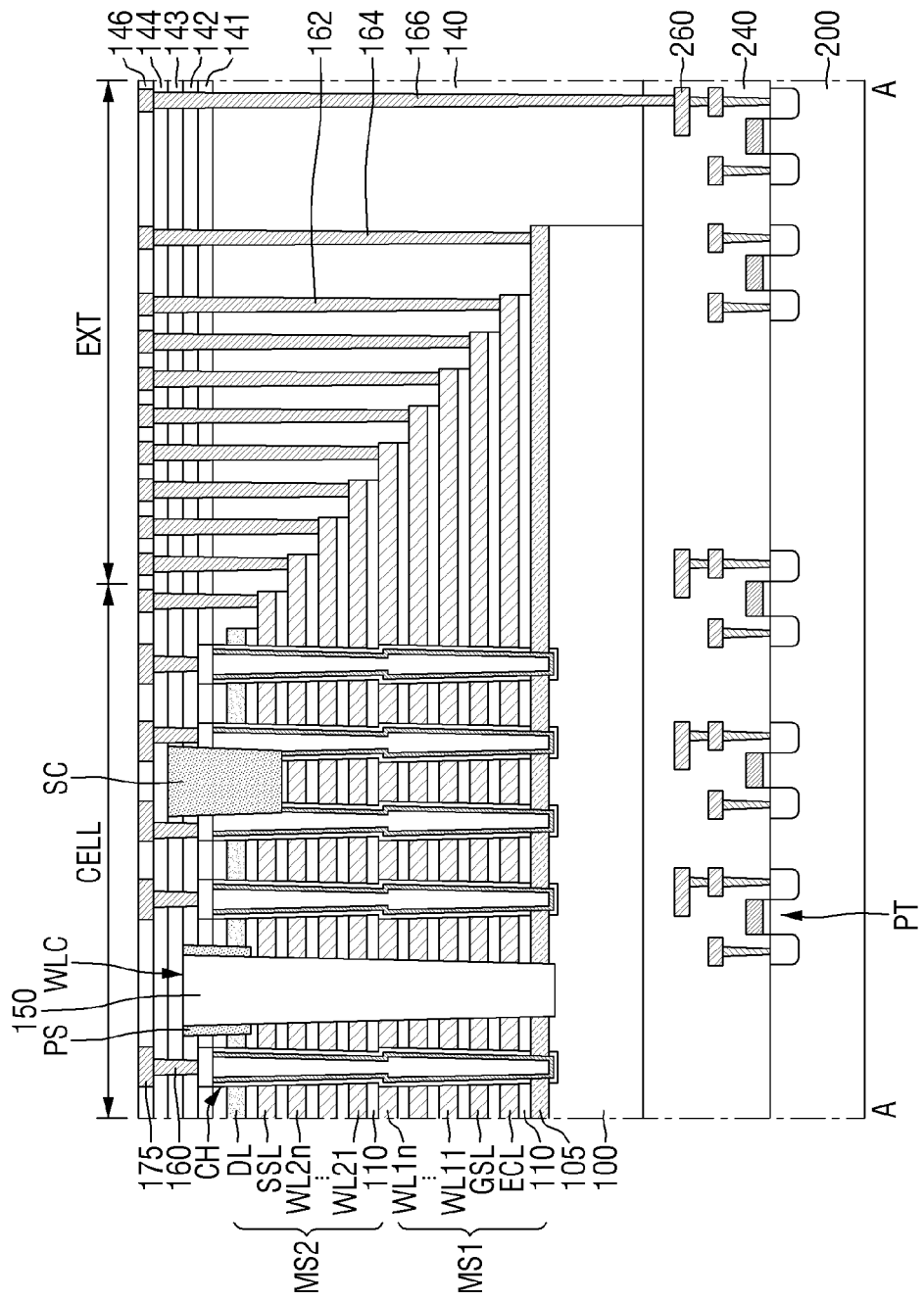
FIG. 24 is a cross-sectional view illustrating a method of fabricating a semiconductor memory device according to some embodiments of the present disclosure.

FIG. 24 is a cross-sectional view illustrating a method of fabricating a semiconductor memory device according to some embodiments of the present disclosure. For convenience, the embodiment of FIG. 24 will hereinafter be described, focusing mainly on the differences with the embodiments of FIGS. 1 through 23. FIG. 24 illustrates an intermediate step following the step illustrated in FIG. 23.

Referring to FIG. 24, contact studs 175 are formed.

The contact studs 175 may be connected to the bitline contacts 160. For example, an eighth interlayer insulating film 146, which covers the fifth interlayer insulating film 144, may be formed. Thereafter, the contact studs 175, which are connected to the bitline contacts 160, may be formed in the eighth interlayer insulating film 146.

The contact studs 175 can improve the contact reliability between the shifted bitline contacts 160 and the bitlines BL. For example, the contact studs 175 can improve the contact reliability with respect to the bitline contacts 160 by increasing the areas of contact with the shifted bitline contacts 160.

In some embodiments, the contact studs 175 may be connected to the gate contacts 162 and/or the source contact 164.

An electronic system including a semiconductor memory device according to some embodiments of the present disclosure will hereinafter be described with reference to FIGS. 1 through 14 and 25 through 28.

Figure 25:
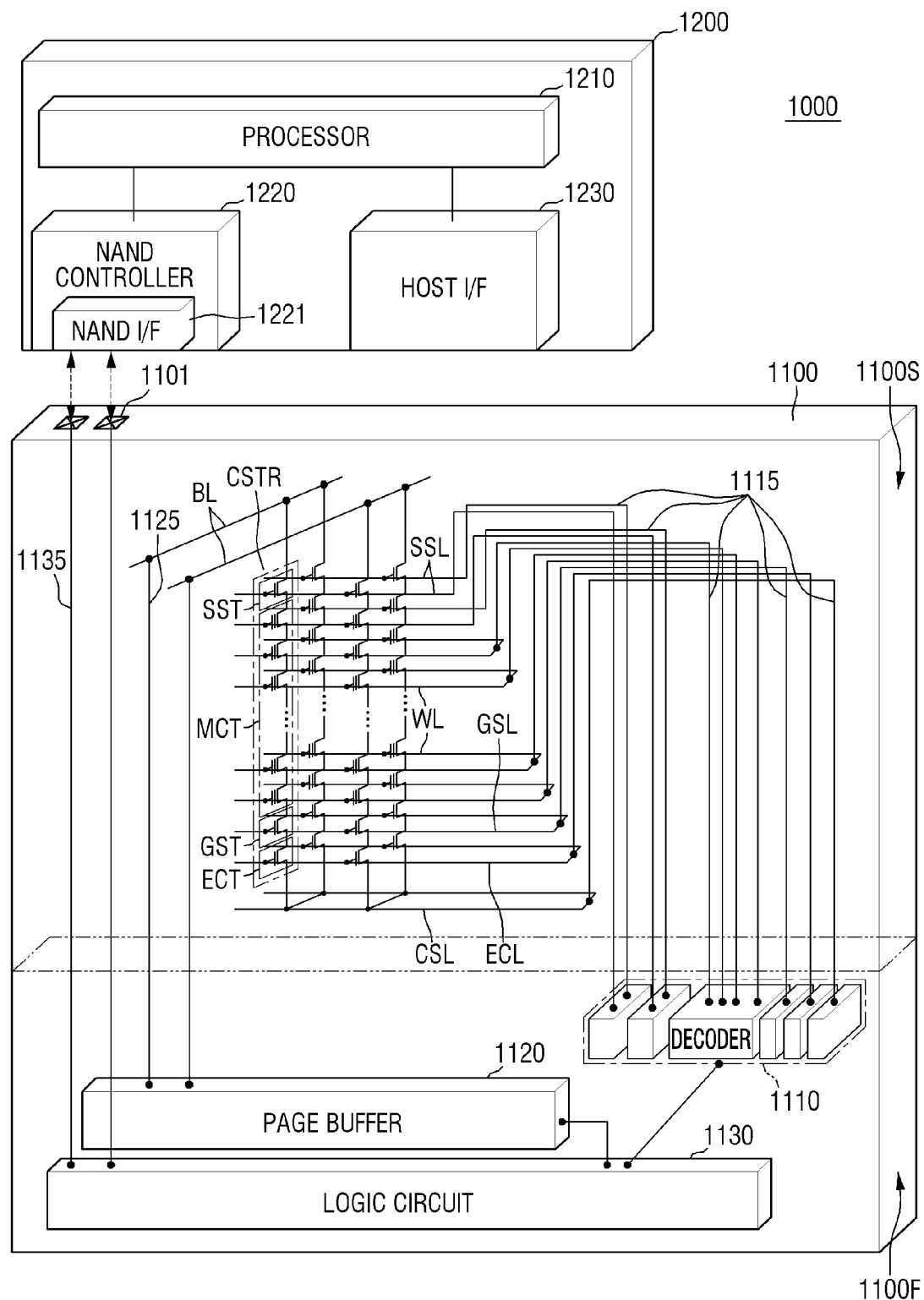
FIG. 25 is a block diagram illustrating an electronic system including a semiconductor memory device according to some embodiments of the present disclosure.
Figure 26:
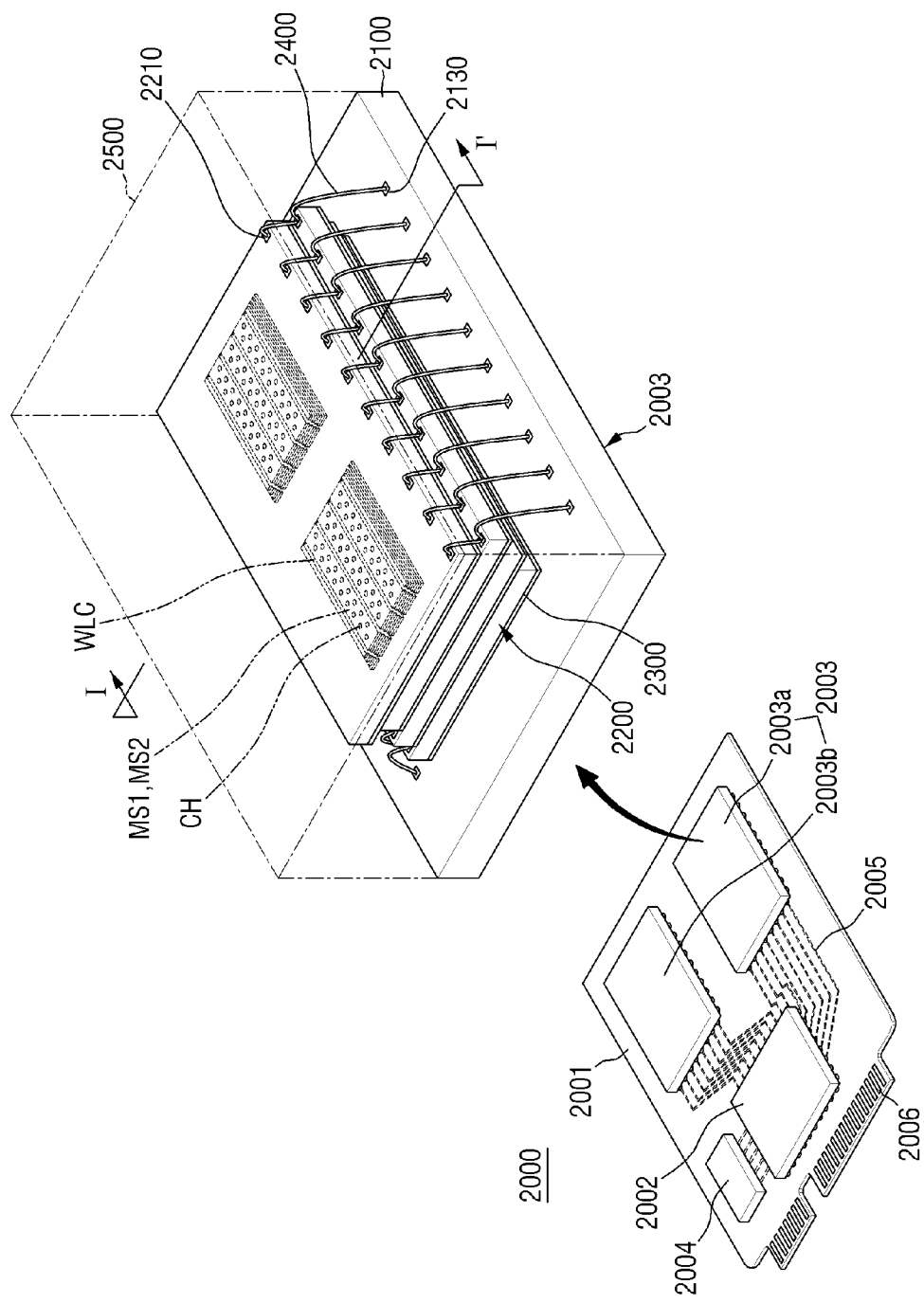
FIG. 26 is a perspective view illustrating an electronic system including a semiconductor memory device according to some embodiments of the present disclosure.
Figure 27:
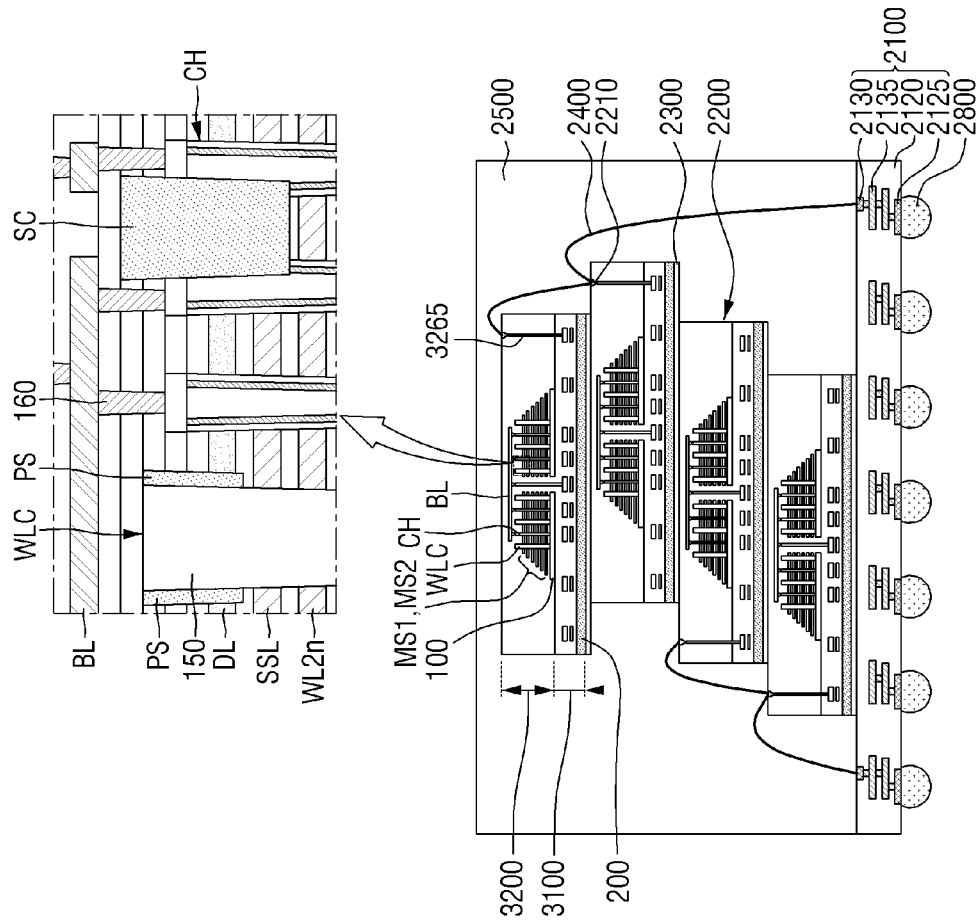
FIG. 27 and FIG. 28 are cross-sectional views taken along line I-I of FIG. 26.
Figure 28:
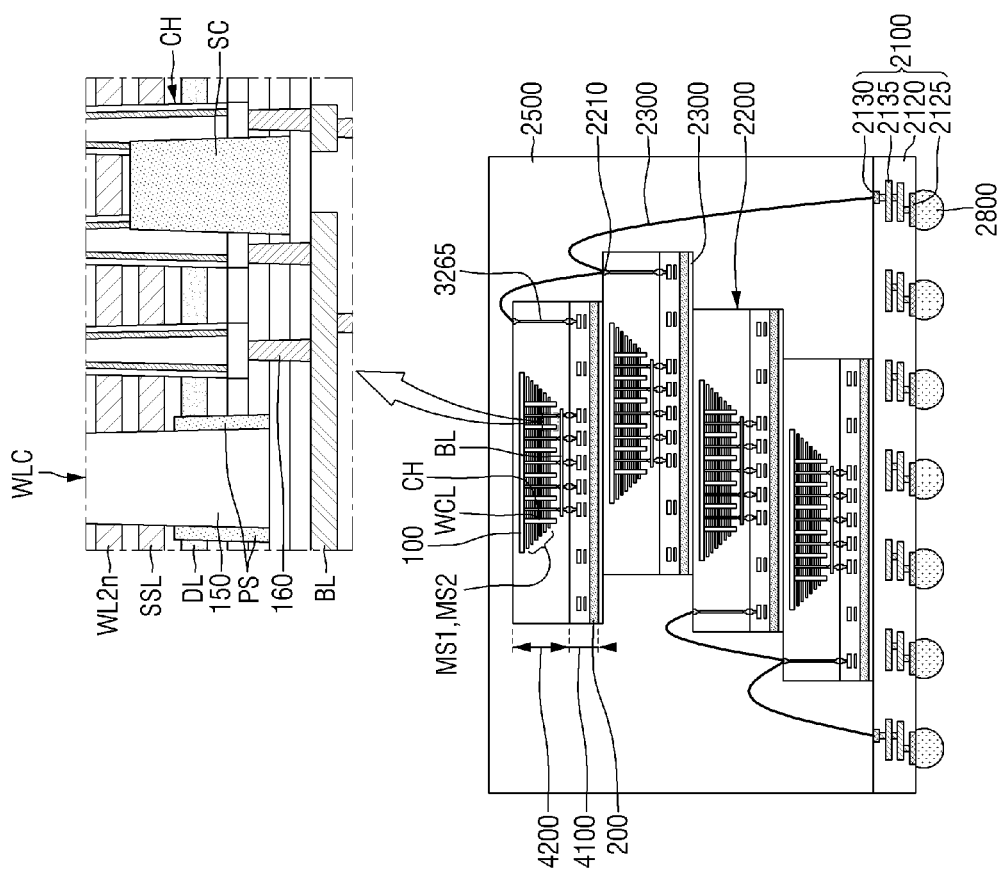

FIG. 25 is a block diagram illustrating an electronic system including a semiconductor memory device according to some embodiments of the present disclosure. FIG. 26 is a perspective view illustrating an electronic system including a semiconductor memory device according to some embodiments of the present disclosure. FIGS. 27 and 28 are cross-sectional views taken along line I-I of FIG. 26.

Referring to FIG. 25, an electronic system 1000 may include a semiconductor memory device 1100 and a controller 1200, which is electrically connected to the semiconductor memory device 1100. The electronic system 1000 may be a storage device including at least one instance of the semiconductor memory device 1100 or an electronic device including the storage device. For example, the electronic system 1000 may be a solid-state drive (SSD) device, a universal serial bus (USB), a computing system, medical equipment, or a communication device including at least one instance of the semiconductor memory device 1100.

The semiconductor memory device 1100 may be a nonvolatile memory device (e.g., a NAND flash memory device) and may be, for example, one of the semiconductor memory devices of FIGS. 1 through 14. The semiconductor memory device 1100 may include a first structure 1100F and a second structure 1100S on the first structure 1100F.

The first structure 1100F may be a peripheral circuit structure including a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1).

The second structure 1100S may include common source lines CSL, a plurality of bitlines BL, and a plurality of cell strings CSTR, as described above with reference to FIG. 2. The cell strings CSTR may be connected to the decoder circuit 1110 through wordlines WL, at least one string selection line SSL, and at least one ground selection line GSL. Also, the cell strings CSTR may be connected to the page buffer 1120 through the bitlines BL.

In some embodiments, the common source lines CSL and the cell strings CSTR may be electrically connected to the decoder circuit 1110 through first connecting wires 1115, which extend from the first structure 1100F to the second structure 1100S. The first connecting wires 1115 may correspond to the through plugs 166 of any one of FIGS. 1 through 14. That is, the through plugs 166 may electrically connect gate electrodes (ECL, GSL, WL, and SSL) and the decoder circuit 1110 (or the row decoder 33 of FIG. 1).

In some embodiments, the bitlines BL may be electrically connected to the page buffer 1120 through second connecting wires 1125, which extend from the first structure 1100F to the second structure 1100S. The second connecting wires 1125 may correspond to the through plugs 166 of any one of FIGS. 1 through 14. That is, the through plugs 166 may electrically connect the bitlines BL and the page buffer 1120 (or the page buffer 35 of FIG. 1).

The semiconductor memory device 1100 may communicate with the controller 1200 through input/output pads 1101, which are electrically connected to the logic circuit 1130 (or the control logic 37 of FIG. 1). The input/output pads 1101 may be electrically connected to the logic circuit 1130 through input/output connecting wires 1135, which extend from the first structure 1100F to the second structure 1100S.

The controller 1200 may include a processor 1210, a NAND controller 1220, and a host interface 1230. In some embodiments, the electronic system 1000 may include a plurality of semiconductor memory devices 1100, in which case, the controller 1200 may control the plurality of semiconductor memory devices 1100.

The processor 1210 may control the general operation of the electronic system 1000 including the controller 1200. The processor 1210 may operate in accordance with predetermined firmware and may access the semiconductor memory device 1100 by controlling the NAND controller 1220. The NAND controller 1220 may include a NAND interface 1221, which handles communication with the semiconductor memory device 1100. Control commands for controlling the semiconductor memory device 1100, data to be written to memory cell transistors MCT of the semiconductor memory device 1100, and data to be read from the memory cell transistors MCT of the semiconductor memory device 1100 may be transmitted through the NAND interface 1221. The host interface 1230 may provide communication between the electronic system 1000 and an external host. In response to a control command being received from an external host through the host interface 1230, the processor 1210 may control the semiconductor memory device 1100 in accordance with the received control command.

Referring to FIG. 26, FIG. 27 and FIG. 28, an electronic system 2000 may include a main substrate 2001, a main controller 2002, which is mounted on the main substrate 2001, one or more semiconductor packages 2003, and a DRAM 2004 (dynamic random access memory). The semiconductor packages 2003 and the DRAM 2004 may be connected to the main controller 2002 by wire patterns 2005, which are formed on the main substrate 2001.

The main substrate 2001 may include a connector 2006, which includes a plurality of pins that can be coupled to an external host. The number and layout of pins of the connector 2006 may vary depending on the type of communication interface between the electronic system 2000 and the external host. In some embodiments, the electronic system 2000 may communicate with the external host using one of the following interfaces: USB, Peripheral Component Interconnect-Express (PCI-Express), Serial Advanced Technology Attachment (SATA), M-PHY for Universal Flash Storage (UFS). In some embodiments, the electronic system 2000 may be operable by power supplied from the external host through the connector 2006. The electronic system 2000 may further include a power management integrated circuit (PMIC), which divides the power from the external host between the main controller 2002 and the semiconductor packages 2003.

The main controller 2002 may write data to, or read data from, the semiconductor packages 2003 and may improve the operating speed of the electronic system 2000.

The DRAM 2004 may be a buffer memory for mitigating the difference between the speed of the semiconductor packages 2003, which are data storages, and the speed of the external host. The DRAM 2004, which is included in the electronic system 2000, may function as a type of cache memory and may provide space for temporarily storing data during a control operation for the semiconductor packages 2003. In a case where the DRAM 2004 is included in the electronic system 2000, the main controller 2002 may further include a DRAM controller for controlling the DRAM 2004 in addition to a NAND controller for controlling the semiconductor packages 2003.

The semiconductor packages 2003 may include first semiconductor package 2003a and second semiconductor package 2003b, which are spaced apart from each other. Each of the first semiconductor package 2003a and second semiconductor package 2003b may be a semiconductor package including multiple semiconductor chips 2200. Each of the first semiconductor package 2003a and second semiconductor package 2003b may include a package substrate 2100, semiconductor chips 2200 on the package substrate 2100, adhesive layers 2300, which are disposed on the bottom surfaces of the semiconductor chips 2200, connecting structures 2400, which electrically connect the semiconductor chips 2200 and the package substrate 2100, and a molding layer 2500, which covers the semiconductor chips 2200 and the connecting structures 2400 on the package substrate 2100.

The package substrate 2100 may be a printed circuit board including package upper pads 2130. Each of the semiconductor chips 2200 may include input/output pads 2210. The input/output pads 2210 may correspond to the input/output pads 1101 of FIG. 23.

In some embodiments, the connecting structures 2400 may be bonding wires that electrically connect the input/output pads 2210 and the package upper pads 2130. Thus, in each of the first semiconductor package 2003a and second semiconductor package 2003b, the semiconductor chips 2200 may be electrically connected to one another via wire bonding and may be electrically connected to the package upper pads 2130 of the package substrate 2100. In some embodiments, in each of the first semiconductor package 2003a and second semiconductor package 2003b, the semiconductor chips 2200 may be electrically connected to one another through connecting structures including through silicon vias (TSVs), instead of connecting structures 2400 which are wire bonding-type.

In some embodiments, the main controller 2002 and semiconductor chips 2200 may be included in a single package. In some embodiments, the main controller 2002 and semiconductor chips 2200 may be mounted on an interposer substrate, which is separate from the main substrate 2001, and may be connected by wires that are formed on the interposer substrate.

In some embodiments, the package substrate 2100 of each of the first semiconductor package 2003a and second semiconductor package 2003b may be a printed circuit board. The package substrate 2100 of each of the first semiconductor package 2003a and second semiconductor package 2003b may include a package substrate body 2120, package upper pads 2130, which are disposed on the top surface of the package substrate body 2120, lower pads 2125, which are disposed or exposed on the bottom surface of the package substrate body 2120, and inner wires 2135, which electrically connect the package upper pads 2130 and the lower pads 2125, in the package substrate body 2120. The package upper pads 2130 may be electrically connected to connecting structures 2400. The lower pads 2125 may be connected to the wire patterns 2005 of the main substrate 2010 of the electronic system 2000 through conductive connectors 2800.

Referring to FIG. 27, each of the semiconductor chips 2200 may include a first peripheral circuit region 3100 and a first cell region 3200, which is stacked on the first peripheral circuit region 3100. Each of the semiconductor chips 2200 may include any one of the semiconductor memory devices of FIGS. 1 through 14. For example, the first peripheral circuit region 3100 may include the second substrate 200 of any one of FIGS. 3A through 6B. Also, for example, the first cell region 3200 may include the first substrate 100, the mold structure (MS1 and MS2), the channel structures CH, the block separation area WLC, the protective structure PS, the string separation structure SC, the bitlines BL, and the bitline contacts 160 of any one of FIGS. 3A through 6B.

Referring to FIG. 28, each of the semiconductor chips 2200 may include a second peripheral circuit region 4100 and a second cell region 4200, which is stacked on the second peripheral circuit region 4100. Each of the semiconductor chips 2200 may include any one of the semiconductor memory devices of FIGS. 1 through 3A and 9. For example, the second peripheral circuit region 4100 may include the second substrate 200 of FIG. 9. Also, for example, the second cell region 4200 may include the first substrate 100, the mold structure (MS1 and MS2), the channel structures CH, the block separation area WLC, the protective structure PS, the string separation structure SC, the bitlines BL, and the bitline contacts 160 of FIG. 9.

While the inventive concept(s) described herein have been particularly shown and described with reference to exemplary embodiments thereof, it will be understood by those of ordinary skill in the art(s) that various changes in form and details may be made therein without departing from the spirit and scope of the inventive concept(s) described herein as defined by the following claims. It is therefore desired that the present embodiments be considered in all respects as illustrative and not restrictive.

What is claimed is:

1. A semiconductor memory device, comprising:
   a mold structure including a plurality of wordlines, which are sequentially stacked on a front side of a first substrate, and a string selection line and a stopper line, which are sequentially stacked on the plurality of wordlines;
   a channel structure extending in a vertical direction, which intersects the front side of the first substrate, to penetrate the mold structure;
   a block separation structure extending in a first direction, which intersects the vertical direction, to cut the mold structure;
   a protective structure interposed between the block separation structure and the stopper line, and not between the block separation structure and the string selection line and not between the block separation structure and the plurality of wordlines;
   a string separation structure extending in the first direction to cut the string selection line and the stopper line;
   a bitline extending in a second direction, which intersects the vertical direction and the first direction, on the mold structure; and
   a bitline contact connecting the channel structure and the bitline,
   wherein the protective structure has a lowermost surface located at a depth above the string selection line, and the block separation structure directly contacts the string selection line and the plurality of word lines below the protective structure.

2. The semiconductor memory device of claim 1, wherein the string separation structure at least partially overlaps with the channel structure.

3. The semiconductor memory device of claim 1, wherein the stopper line and the protective structure include materials different from each other.

4. The semiconductor memory device of claim 3, wherein the stopper line includes silicon nitride, and
   the protective structure includes silicon oxide.

5. The semiconductor memory device of claim 1, wherein the string separation structure includes silicon oxide.

6. The semiconductor memory device of claim 1, wherein a top surface of the string separation structure is positioned higher than a top surface of the protective structure.

7. The semiconductor memory device of claim 1, wherein a top surface of the bitline contact is positioned higher than a top surface of the string separation structure.

8. The semiconductor memory device of claim 1, wherein the bitline contact is spaced apart from the string separation structure.

9. The semiconductor memory device of claim 1, further comprising:
   a second substrate including a front side that faces the front side of the first substrate; and
   a peripheral circuit element on the front side of the second substrate.

10. The semiconductor memory device of claim 9, wherein the bitline is interposed between the first substrate and the second substrate.

11. The semiconductor memory device of claim 1, wherein an uppermost surface of the protective structure is horizontally aligned with an uppermost surface of the block separation structure.

12. A semiconductor memory device, comprising:
   a mold structure including a plurality of wordlines, which are sequentially stacked on a front side of a substrate, and a string selection line and a stopper line, which are sequentially stacked on the plurality of wordlines;
   a first channel structure extending in a vertical direction, which intersects the front side of the substrate, to penetrate the mold structure;
   a string separation structure extending in a first direction, which intersects the vertical direction, to cut the string selection line and the stopper line, the string separation structure at least partially overlapping with the first channel structure;
   a bitline extending in a second direction, which intersects the vertical direction and the first direction, on the mold structure;
   a first bitline contact connecting the first channel structure and the bitline;
   a block separation structure extending in the first direction to cut the mold structure; and
   a protective structure interposed between the block separation structure and the stopper line, and not between the block separation structure and the string selection line and not between the block separation structure and the plurality of wordlines, wherein the first bitline contact is shifted from a center of the first channel structure in a direction away from the string separation structure, and wherein the protective structure has a lowermost surface located at a depth above the string selection line, and the block separation structure directly contacts the string selection line and the plurality of word lines below the protective structure.

13. The semiconductor memory device of claim 12, wherein the first bitline contact is in contact with a top surface of the stopper line.

14. The semiconductor memory device of claim 12, wherein the first bitline contact is in contact with a side surface of the first channel structure.

15. The semiconductor memory device of claim 12, further comprising:

a contact stud connecting the first bitline contact and the bitline, wherein the contact stud is shifted from a center of the first bitline contact in a direction toward the string separation structure.

16. The semiconductor memory device of claim 12, further comprising:

a second channel structure extending in the vertical direction to penetrate the mold structure, the second channel structure being spaced apart from the first channel structure with the string separation structure interposed therebetween, wherein the string separation structure at least partially overlaps with the second channel structure.

17. The semiconductor memory device of claim 16, further comprising:

a second bitline contact connected to the second channel structure, wherein the second bitline contact is shifted from a center of the second channel structure in a direction away from the string separation structure.

18. The semiconductor memory device of claim 12, further comprising:

a second channel structure extending in the vertical direction to penetrate the mold structure, the second channel structure being spaced apart from the string separation structure with the first channel structure interposed therebetween;

a second bitline contact connecting the second channel structure and the bitline;

a third channel structure extending in the vertical direction to penetrate the mold structure, the third channel structure being spaced apart from the first channel structure with the string separation structure interposed therebetween; and a third bitline contact connecting the third channel structure and the bitline, wherein a distance between the first bitline contact and second bitline contact is smaller than a distance between the first bitline contact and third bitline contact.

19. The semiconductor memory device of claim 18, wherein the first channel structure to third channel structure are arranged at regular intervals in the first direction.

20. An electronic system, comprising:

a main substrate;

a semiconductor memory device on the main substrate; and a controller electrically connected to the semiconductor memory device, on the main substrate, wherein the semiconductor memory device includes:

a mold structure including a plurality of wordlines, which are sequentially stacked on a front side of a substrate, and a string selection line and a stopper line, which are sequentially stacked on the wordlines;

a channel structure extending in a vertical direction, which intersects the front side of the substrate, to penetrate the mold structure;

a string separation structure extending in a first direction, which intersects the vertical direction, to cut the string selection line and the stopper line, the string separation structure at least partially overlapping with the channel structure;

a bitline extending in a second direction, which intersects the vertical direction and the first direction, on the mold structure;

a bitline contact connecting the channel structure and the bitline, the bitline contact being shifted from a center of the channel structure in a direction away from the string separation structure;

a peripheral circuit element connected to the bitline contact;

an input/output pad connecting the controller and the peripheral circuit element;

a block separation structure extending in the first direction to cut the mold structure; and a protective structure interposed between the block separation structure and the stopper line, and not between the block separation structure and the string selection line and not between the block separation structure and the plurality of wordlines, wherein the protective structure has a lowermost surface located at a depth above the string selection line, and that the block separation structure directly contacts the string selection line and the plurality of word lines below the protective structure.

* * * * *